United States Patent
Sasaki et al.

(10) Patent No.: US 9,496,134 B2
(45) Date of Patent: Nov. 15, 2016

(54) SUBSTRATE PROCESSING APPARATUS, METHOD OF MANUFACTURING SEMICONDUCTOR DEVICE AND SEMICONDUCTOR DEVICE

(75) Inventors: Shinya Sasaki, Toyama (JP); Yuji Takebayashi, Toyama (JP); Shintaro Kogura, Toyama (JP)

(73) Assignee: HITACHI KOKUSAI ELECTRIC INC., Tokyo (JP)

(*) Notice: Subject to any disclaimer, the term of this patent is extended or adjusted under 35 U.S.C. 154(b) by 831 days.

(21) Appl. No.: 13/289,450

(22) Filed: Nov. 4, 2011

(65) Prior Publication Data

US 2012/0119337 A1    May 17, 2012

(30) Foreign Application Priority Data

Nov. 11, 2010  (JP) ................. 2010-253231

(51) Int. Cl.
    *H01L 21/02* (2006.01)
    *C23C 16/40* (2006.01)
    *C23C 16/455* (2006.01)

(52) U.S. Cl.
    CPC ......... *H01L 21/0228* (2013.01); *C23C 16/403* (2013.01); *C23C 16/45527* (2013.01); *C23C 16/45546* (2013.01); *C23C 16/45578* (2013.01); *H01L 21/02178* (2013.01)

(58) Field of Classification Search
    CPC .................................................. H01L 21/0228
    See application file for complete search history.

(56) References Cited

U.S. PATENT DOCUMENTS

| 2005/0287806 A1 | 12/2005 | Matsuura |
| 2011/0031593 A1* | 2/2011 | Saito et al. .................. 257/632 |

FOREIGN PATENT DOCUMENTS

| JP | 03-209817 | 12/1991 |
| JP | 8115883 A | 5/1996 |
| JP | 2006013490 A | 1/2006 |
| JP | 2007-507902 A | 3/2007 |
| KR | 10-2000-0009190 A | 2/2000 |

* cited by examiner

*Primary Examiner* — Daniel Luke
(74) *Attorney, Agent, or Firm* — Volpe and Koenig, P.C.

(57) ABSTRACT

Provided is a substrate processing apparatus capable of suppressing accumulation of reaction products or decomposed matters on an inner wall of a nozzle and suppressing scattering of foreign substances in a process chamber. The substrate processing apparatus includes a process chamber, a heating unit, a source gas supply unit, a source gas nozzle, an exhaust unit, and a control unit configured to control at least the heating unit, the source gas supply unit and the exhaust unit. The source gas nozzle is disposed at a region in the process chamber, in which a first process gas is not decomposed even under a temperature in the process chamber higher than a pyrolysis temperature of the first process gas, and the control unit supplies the first process gas into the process chamber two or more times at different flow velocities to prevent the first process gas from being mixed.

10 Claims, 26 Drawing Sheets

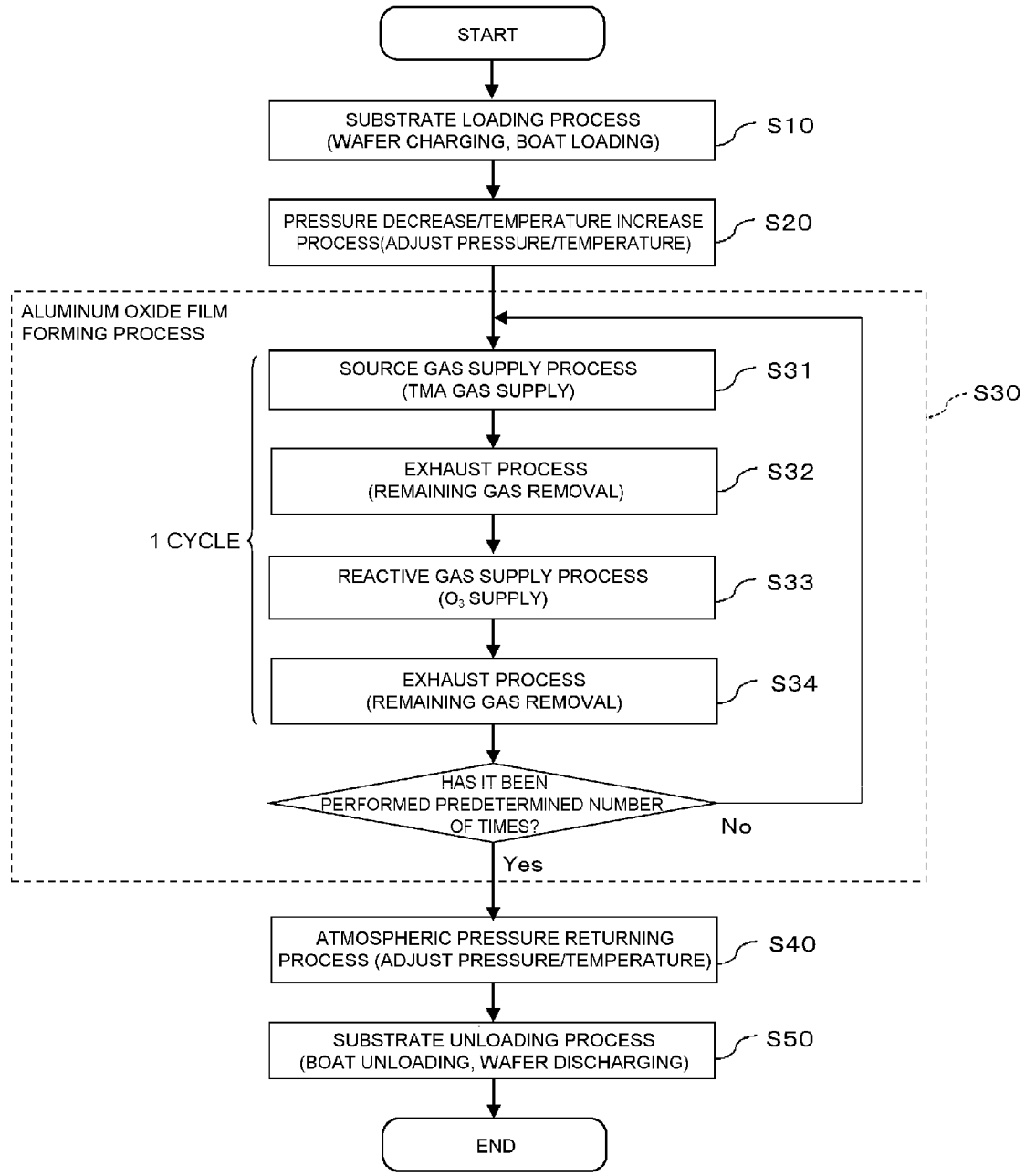

BEFORE SUBSTRATE
PROCESSING PROCESS

AFTER SUPPLY OF TMA GAS

AFTER SUPPLY OF TMA GAS

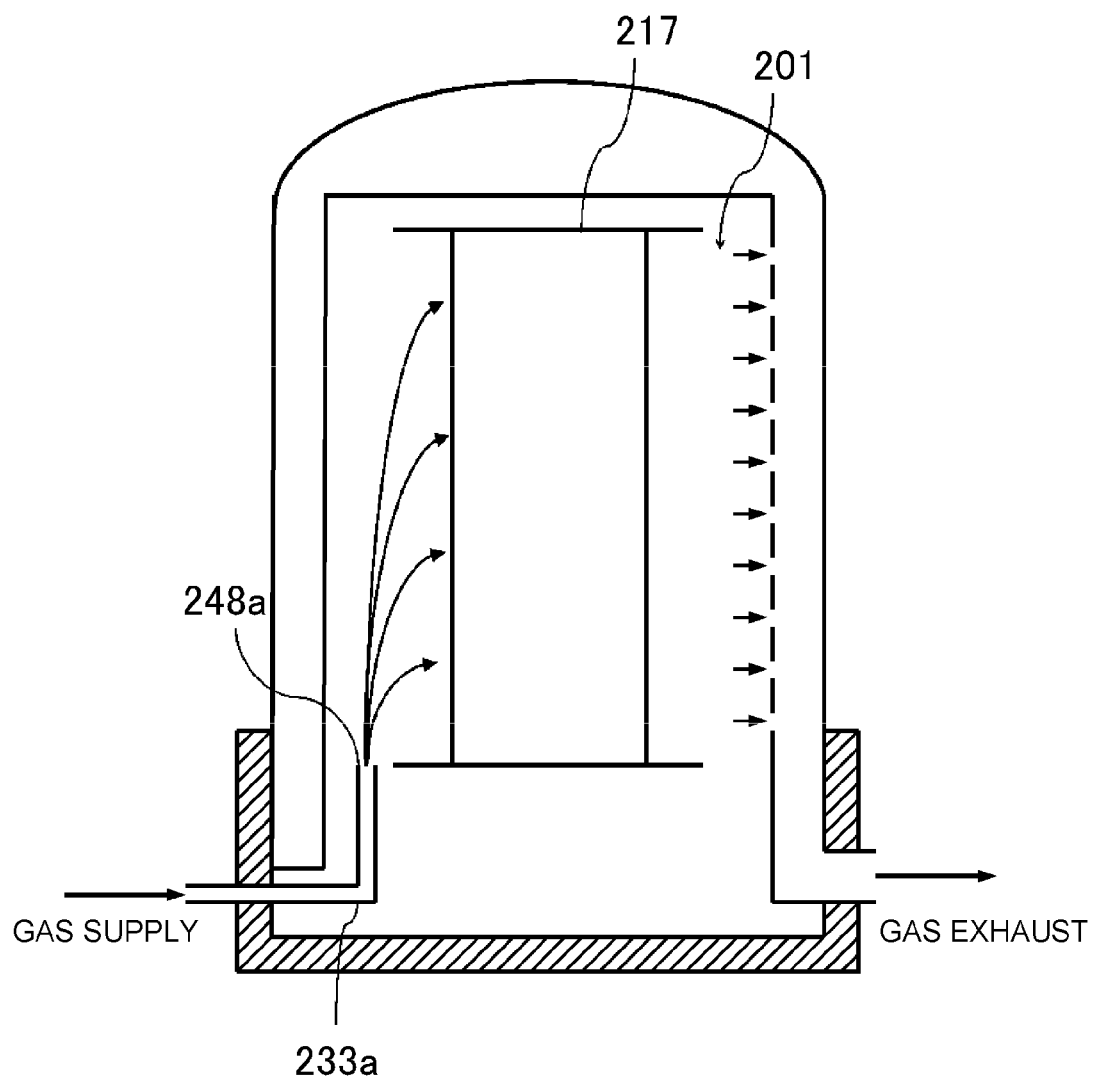

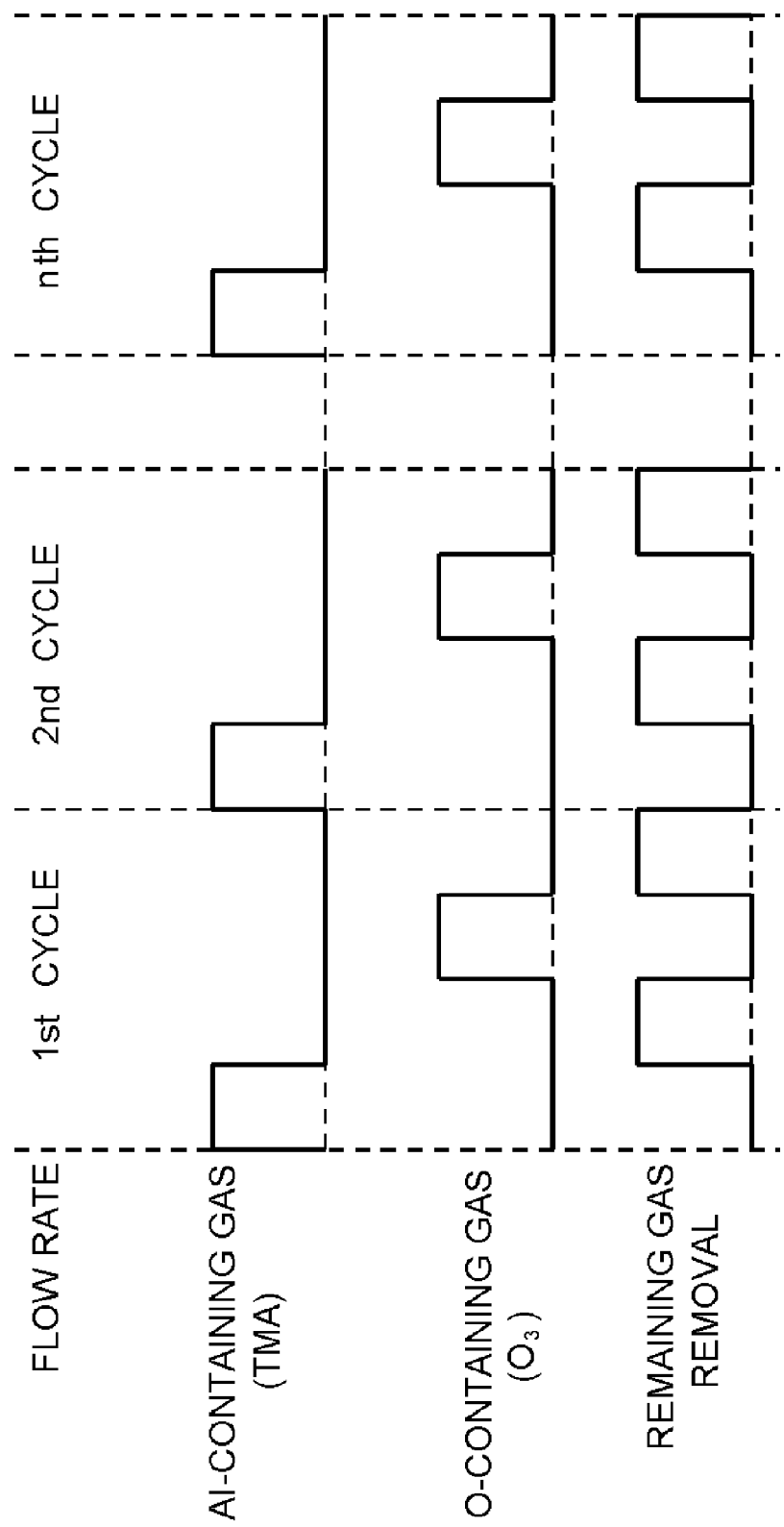

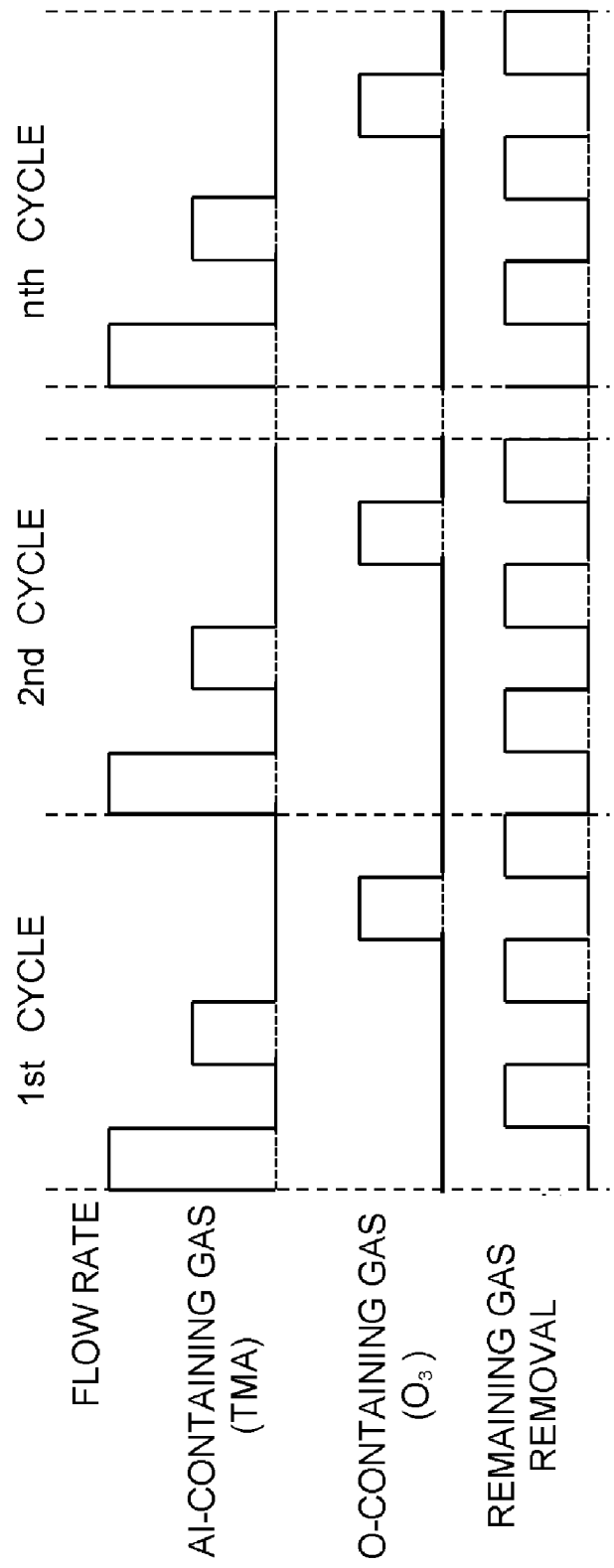

FIG. 13

| VALVE OPERATION SEQUENCE | PROCESS | GAS FLOW RATE | | |
|---|---|---|---|---|
| | | N$_2$ GAS [SLM] | AR GAS [SLM] | DETAILS |
| EXAMPLES | FIRST SOURCE GAS SUPPLY PROCESS (S131) | 3 | 0 | DILUTED N$_2$ GAS STABLE ATMOSPHERE |
| | | 3 | 0.5 | SUPPLY TMA INTO PROCESS CHAMBER AT FIRST FLOW RATE |
| | EXHAUST PROCESS (S132) | 5 | 0 | PURGE INSIDE OF PROCESS CHAMBER AND NOZZLE |
| | | 0 | 0 | VACUUM SUCTION INSIDE OF PROCESS CHAMBER AND NOZZLE |
| | | 5 | 0 | PURGE INSIDE OF PROCESS CHAMBER AND NOZZLE |
| | SECOND SOURCE GAS SUPPLY PROCESS (S133) | 20 | 0 | DILUTED N$_2$ GAS STABLE ATMOSPHERE |
| | | 20 | 0.5 | SUPPLY TMA INTO PROCESS CHAMBER AT SECOND FLOW RATE |
| | EXHAUST PROCESS (S134) | 5 | 0 | PURGE INSIDE OF PROCESS CHAMBER AND NOZZLE |
| | | 0 | 0 | VACUUM SUCTION INSIDE OF PROCESS CHAMBER AND NOZZLE |
| | | 5 | 0 | PURGE INSIDE OF PROCESS CHAMBER AND NOZZLE |
| CONVENTIONAL EXAMPLES | - | 15 | 0 | DILUTED N$_2$ GAS STABLE ATMOSPHERE |
| | - | 15 | 0.5 | SUPPLY TMA INTO PROCESS CHAMBER |
| | - | 5 | 0 | PURGE INSIDE OF PROCESS CHAMBER AND NOZZLE |
| | - | 0 | 0 | VACUUM SUCTION INSIDE OF PROCESS CHAMBER AND NOZZLE |
| | - | 5 | 0 | PURGE INSIDE OF PROCESS CHAMBER AND NOZZLE |

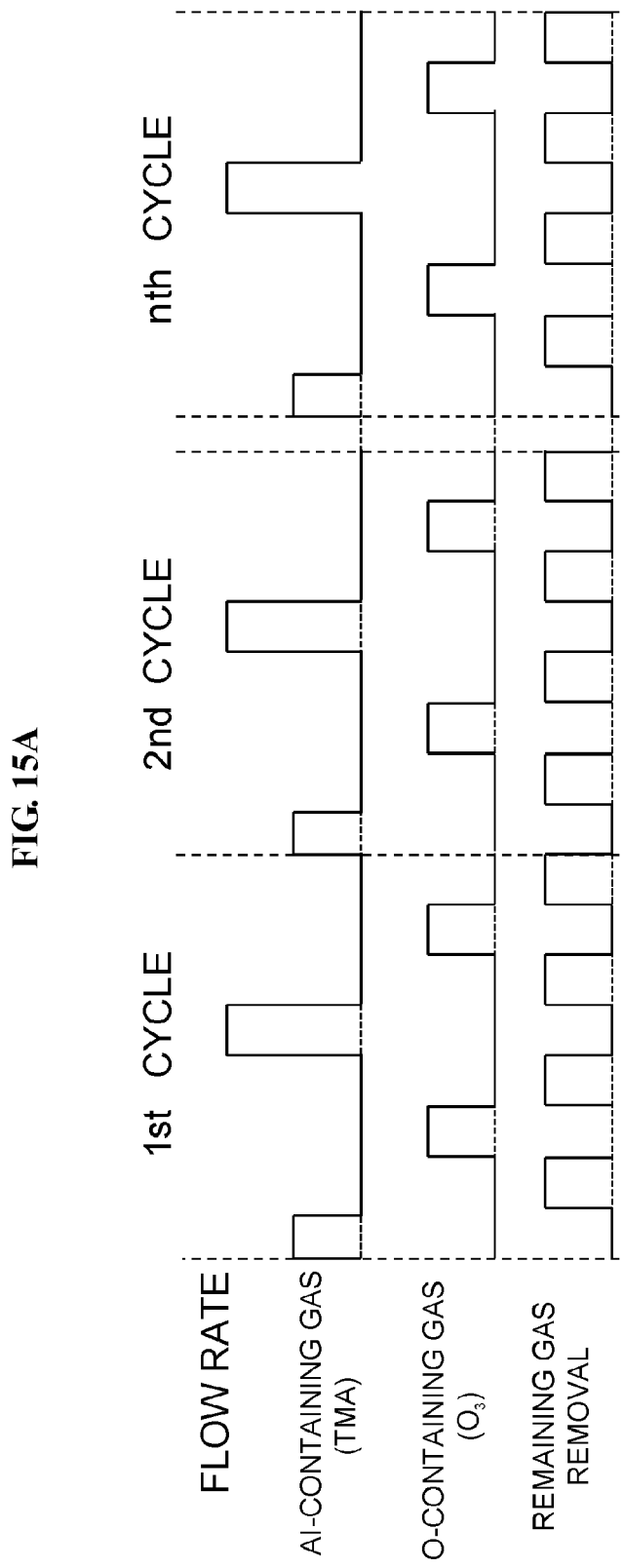

| ITEMS | | EXAMPLE | CONVENTIONAL EXAMPLES | |
|---|---|---|---|---|
| | | 550°C | 380°C | 550°C |
| FILM PROPERTIES | FILM THICKNESS | 103.8Å | 100Å | 81.2Å |
| | FILM THICKNESS UNIFORMITY IN WAFER SURFACE | ±1.7% | ±1.0% | ±1.3% |
| | FILM THICKNESS UNIFORMITY BETWEEN WAFERS | ±1.1% | ±1.0% | ±4.1% |
| | NUMBER OF FOREIGN SUBSTANCES | 59 | 30 | 30 TO 500 |
| ACCUMULATION OF DECOMPOSED MATTERS IN NOZZLE | | NONE | NONE | NONE |

<Prior Art>

<Prior Art>

<Prior Art>

<Prior Art>

SUBSTRATE PROCESSING APPARATUS, METHOD OF MANUFACTURING SEMICONDUCTOR DEVICE AND SEMICONDUCTOR DEVICE

CROSS-REFERENCE TO RELATED PATENT APPLICATION

This U.S. non-provisional patent application claims priority under 35 U.S.C. §119 of Japanese Patent Application No. 2010-253231, filed on Nov. 11, 2010, in the Japanese Patent Office, the entire contents of which are hereby incorporated by reference.

BACKGROUND OF THE INVENTION

1. Field of the Invention

The present invention relates to a substrate processing apparatus, a method of manufacturing a semiconductor device, and a semiconductor device.

2. Description of the Related Art

In atomic layer deposition (ALD), for example, a source gas, which is a source material of a film, and a reactive gas, which reacts with the source gas, are alternately supplied into a process chamber so that a thin film is sequentially deposited by one atomic layer, forming a predetermined film on a substrate. The film formed by the ALD may be, for example, an aluminum oxide film (AlO film) formed by trimethylaluminum (TMA) gas, which is a source gas and ozone ($O_3$) gas, which is a reactive gas. The aluminum oxide film functions as a high-k film.

RELATED ART DOCUMENT

Patent Document 1

1. Japanese Patent Laid-open Publication No. H8-115883
2. Japanese Patent Laid-open Publication No. 2006-13490

SUMMARY OF THE INVENTION

ALD using TMA gas and ozone gas may be performed at a temperature in a process chamber set to 200° C. to 400° C. However, at such a process temperature, carbon (C) atoms and hydrogen (H) atoms constituting a source gas or a reactive gas may remain in a film as impurities, causing a decrease in performance of a high-k film, for example, a decrease in permittivity of the film or an increase in leak current. Accordingly, in order to reduce the impurities in the film, the process temperature is increased to, for example, about 550° C. to perform treatment of a substrate.

However, when a process temperature becomes high, the inside of a nozzle reaches a high temperature and high pressure state, and a source gas may be pyrolyzed in the nozzle. For example, when TMA gas is used as a source gas, reaction products may be formed by a chemical vapor deposition (CVD) reaction between aluminum (Al) atoms in the nozzle. Otherwise, the reaction products or decomposed matters of the TMA gas may be accumulated on an inner wall of the nozzle, clogging the nozzle. In addition, as foreign substances generated by separation of the reaction products or the decomposed matters from the inner wall of the nozzle are scattered in the process chamber to be stuck to the substrate, substrate processing quality may be decreased.

In order to solve these problems, an object of the present invention is to provide a substrate processing apparatus and a method of manufacturing a semiconductor device that are capable of suppressing accumulation of reaction products or decomposed matters on an inner wall of a nozzle and suppressing foreign substances from being scattered in a process chamber. In addition, another object of the present invention is to provide a semiconductor device having a high-quality thin film with minute introduction of the foreign substances through the substrate processing apparatus and the method of manufacturing the semiconductor device.

According to an aspect of the present invention, there is provided a substrate processing apparatus including: a process chamber configured to accommodate therein a plurality of substrates stacked horizontally; a heating unit installed outside the process chamber and configured to heat an inside of the process chamber; a source gas supply unit configured to supply a first process gas; a source gas nozzle connected to the source gas supply unit and configured to supply the first process gas supplied from the source gas supply unit into the process chamber; an exhaust unit configured to exhaust the inside of the process chamber in a substantially horizontal direction; and a control unit configured to control at least the heating unit, the source gas supply unit and the exhaust unit, wherein the source gas nozzle is disposed in a region in the process chamber where the first process gas is not decomposed even when an inside temperature of the process chamber is higher than a pyrolysis temperature of the first process gas, and the control unit controls the source gas supply unit to supply the first process gas into the process chamber at least two times at different flow velocities such that the first process gas is prevented from being mixed.

According to another aspect of the present invention, there is provided a method of manufacturing a semiconductor device including: (a) loading a plurality of substrates stacked horizontally into a process chamber; (b) supplying a first process gas into the process chamber at a first flow velocity through a source gas nozzle disposed in a region in the process chamber where the first process gas is not decomposed even when an inside temperature of the process chamber is higher than a pyrolysis temperature of the first process gas; (c) supplying the first process gas into the process chamber at a second flow velocity different from the first flow velocity through the source gas nozzle; (d) supplying a second process gas into the process chamber through a reactive gas nozzle disposed in the process chamber in a stacking direction of the plurality of substrates; (e) exhausting the process chamber in a substantially horizontal direction; and (f) unloading the plurality of substrates from the process chamber, wherein a cycle comprising the steps (b) through (d) is performed at least once to form a thin film on each of the plurality of substrates.

According to still another aspect of the present invention, there is provided a semiconductor device including a thin film disposed on a substrate formed by performing (a) supplying a first process gas into a process chamber accommodating the substrate at a first flow velocity through a source gas nozzle disposed in a region in the process chamber where the first process gas is not decomposed even when an inside temperature of the process chamber is higher than a pyrolysis temperature of the first process gas; (b) supplying the first process gas into the process chamber at a second flow velocity different from the first flow velocity through the source gas nozzle; (c) supplying a second process gas into the process chamber through a reactive gas nozzle disposed in the process chamber in a stacking direction of the substrate; and (d) performing a cycle comprising the steps (a) through (c) at least once.

According to still another aspect of the present invention, substrate processing method comprising: (a) supplying a first process gas into a process chamber at a first flow velocity through a source gas nozzle installed in a region lower than a stacking region of a substrate accommodated in the process chamber; (b) supplying the first process gas into the process chamber at a second flow velocity different from the first flow velocity through the source gas nozzle; (c) supplying a second process gas into the process chamber through a reactive gas nozzle disposed to correspond to the stacking region of the substrate; (d) exhausting the first process gas or the second process gas in a substantially horizontal direction with respect to a surface of the substrate; and (e) performing steps (a) through (c) a plurality of times to form a film on the substrate.

According to the present invention, accumulation of reaction products or decomposed matters on an inner wall of a nozzle can be suppressed, and scattering of foreign substances in a process chamber can be suppressed. In addition, sticking of the foreign substances to a substrate can be suppressed to avoid a decrease in substrate processing quality.

BRIEF DESCRIPTION OF THE DRAWINGS

FIG. 6 is a flowchart of a substrate processing process in accordance with the first embodiment of the present invention;

FIG. 8 is a view schematically showing a gas supply flow in accordance with the first embodiment of the present invention;

FIG. 9 is a timing chart according to a gas supply of the first embodiment of the present invention;

FIGS. 12A and 12B are timing charts of the substrate processing process in accordance with the second embodiment of the present invention;

FIG. 13 is a view showing a TMA gas supply sequence and processing conditions in accordance with the second embodiment of the present invention in comparison with a conventional art;

FIGS. 15A and 15B are timing charts according to a gas supply in accordance with the third embodiment of the present invention;

FIG. 18 is a view showing presence of accumulation of decomposed matters in a nozzle and film properties of an aluminum oxide film, comparing an example of the second embodiment of the present invention with a conventional example.

DETAILED DESCRIPTION OF THE PREFERRED EMBODIMENTS

<First Embodiment of the Invention>
(1) Configuration of Substrate Processing Apparatus First, a configuration example of a substrate processing apparatus 101 in accordance with an embodiment of the present invention will be described with reference to FIGS. 1 and 5.

Figure 1:
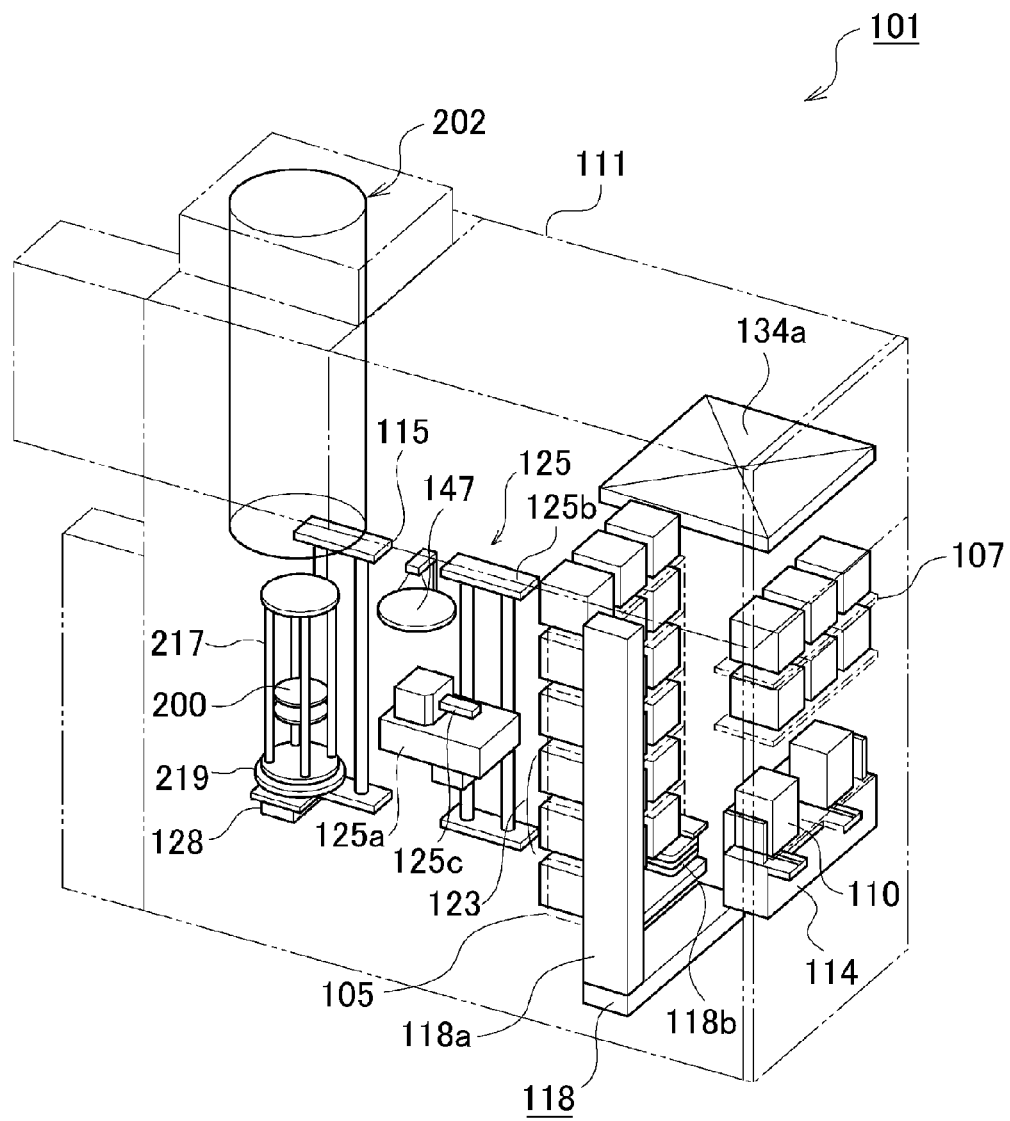
FIG. 1 is a schematic view of a substrate processing apparatus in accordance with a first embodiment of the present invention.

FIG. 1 is a schematic configuration view of a substrate processing apparatus 101 in accordance with an embodiment of the present invention. FIG. 5 is a schematic view showing a gas flow generated in a process tube installed at the substrate processing apparatus in accordance with an embodiment of the present invention.

As shown in FIG. 1, the substrate processing apparatus 101 in accordance with the embodiment includes a housing 111. In order to convey a wafer 200, which is a substrate formed of silicon, into/from the housing 111, a cassette 110, which is a wafer carrier (a substrate receiving vessel) for receiving a plurality of wafers 200, is used. A cassette stage (a substrate receiving vessel delivery platform) 114 is installed at a front side (a right side of the drawing) in the housing 111. The cassette 110 is configured to be placed on the cassette stage 114 by an in-process conveyance apparatus (not shown) and to be taken out of the housing 111 from above the cassette stage 114.

The cassette 110 is placed on the cassette stage 114 such that the wafer 200 in the cassette 110 is in a vertical posture and a wafer entrance of the cassette 110 is directed upward by the in-process conveyance apparatus. The cassette stage 114 is configured to longitudinally rotate the cassette 110 by 90° toward a rear side of the housing 111, position the wafer 200 in the cassette 110 in a horizontal posture, and direct the wafer entrance of the cassette 110 toward the rear side in the housing 111.

A cassette shelf (a substrate-receiving vessel placing shelf) 105 is installed at a substantially center portion in the housing 111 in forward and rearward directions. The cassette shelf 105 is configured to store the plurality of cassettes 110 in a plurality of rows and a plurality of columns. A transfer shelf 123 on which the cassette 110 to be conveyed by a wafer transfer mechanism 125 (described later) is received is installed at the cassette shelf 105. In addition, a preliminary cassette shelf 107 is installed over the cassette stage 114 to preliminarily store the cassette 110.

A cassette conveyance apparatus (a substrate receiving vessel conveyance apparatus) 118 is installed between the cassette stage 114 and the cassette shelf 105. The cassette conveyance apparatus 118 includes a cassette elevator (a substrate-receiving vessel elevation mechanism) 118a configured to raise and lower the cassette 110 in a holding state, and a cassette conveyance mechanism (a substrate-receiving vessel conveyance mechanism) 118b configured to horizontally move the cassette 110 in a holding state. The cassette conveyance apparatus 118 is configured such that the cassette 110 is conveyed between the cassette stage 114, the cassette shelf 105, the preliminary cassette shelf 107 and the transfer shelf 123 by an interlocking operation of the cassette elevator 118a and the cassette conveyance mechanism 118b.

A wafer transfer mechanism (a substrate transfer mechanism) 125 is installed at a rear side of the cassette shelf 105. The wafer transfer mechanism 125 includes a wafer transfer apparatus (a substrate transfer apparatus) 125a configured to rotate or linearly move the wafer 200 in a horizontal direction, and a wafer transfer apparatus elevator (a substrate transfer apparatus elevation mechanism) 125b configured to raise and lower the wafer transfer apparatus 125a. In addition, the wafer transfer apparatus 125a includes tweezers (a substrate transfer tool) 125c configured to hold the wafer 200 in a horizontal posture. The wafer transfer mechanism 125 is configured such that the wafer 200 is picked up from the inside of the cassette 110 on the transfer shelf 123 to be loaded on a boat (a substrate holding mechanism, which will be described later) 217, or the wafer 200 is unloaded (discharged) from the boat 217 to be received into the cassette 110 on the transfer shelf 123 by an interlocking operation of the wafer transfer apparatus 125a and the wafer transfer apparatus elevator 125b.

A process furnace 202 is installed at a rear upper side of the housing 111. An opening (a furnace port) is installed at a lower end of the process furnace 202, and the opening is configured to be opened and closed by a furnace port shutter (furnace port opening/closing mechanism) 147. In addition, a configuration of the process furnace will be described later.

A boat elevator (a substrate holder elevation mechanism) 115, which is an elevation mechanism configured to raise and lower the boat 217 to convey the boat 217 into/from the process furnace 202, is installed under the process furnace 202. An arm 128, which is a connecting tool, is installed at an elevation platform of the boat elevator 115. A disc-shaped seal cap 219, which is a cover configured to hermetically close a lower end of the process furnace 202 when the boat 217 is raised by the boat elevator 115 while vertically supporting the boat 217, is horizontally installed on the arm 128.

The boat 217, which includes a plurality of holding members, is configured to concentrically align a plurality of wafers 200 (for example, about 50 to 150 sheets) in a horizontal posture in a vertical direction and hold the plurality of wafers 200 in a multi-stage. A configuration of the boat 217 will be described in further detail later.

A clean unit 134a including a supply fan and an anti-vibration filter is installed over the cassette shelf 105. The clean unit 134a is configured to communicate clean air of a cleaned atmosphere to the inside of the housing 111.

In addition, a clean unit (not shown) including a supply fan configured to supply clean air and an anti-vibration filter is installed at a left side end of the housing 111 opposite to the wafer transfer apparatus elevator 125b and the boat elevator 115. The clean air injected from the clean unit (not shown) flows around the wafer transfer apparatus 125a and the boat 217 and then is suctioned by an exhaust apparatus (not shown) to be exhausted to the outside.

(2) Operation of Substrate Processing Apparatus

Hereinafter, an operation of the substrate processing apparatus 101 in accordance with the embodiment will be described.

First, the cassette 110 is placed on the cassette stage 114 such that the wafer 200 is disposed in a vertical posture and the wafer entrance of the cassette 110 is directed upward by the in-process conveyance apparatus (not shown). Then, the cassette 110 is rotated by 90° in a longitudinal direction toward a rear side of the housing 111 by the cassette stage 114. As a result, the wafer 200 in the cassette 110 is disposed in a horizontal posture, and the wafer entrance of the cassette 110 is directed to the rear side of the housing 111.

The cassette 110 is automatically conveyed, delivered and temporarily stored on the cassette shelf 105 and a designated shelf position of the preliminary cassette shelf 107 by the cassette conveyance apparatus 118, and then, transferred from the cassette shelf 105 or the preliminary cassette shelf 107 to the transfer shelf 123, or directly conveyed to the transfer shelf 123.

When the cassette 110 is transferred to the transfer shelf 123, the wafer 200 is picked up from the cassette 110 through the wafer entrance by the tweezers 125c of the wafer transfer apparatus 125a, and loaded (charged) to the boat 217 behind the transfer shelf 123 by a continuous operation of the wafer transfer apparatus 125a and the wafer transfer apparatus elevator 125b. The wafer transfer mechanism 125 which delivered the wafer 200 to the wafer 217 returns to the cassette 110, and then, loads the next wafer 200 on the boat 217.

When a predetermined number of wafers 200 are loaded on the boat 217, the lower end of the process furnace closed by a furnace port shutter 147 is opened by the furnace port shutter 147. Then, as the seal cap 219 is raised by the boat elevator 115, the boat 217 holding a group of the wafers 200 is loaded into the process furnace. After the loading, arbitrary processing is performed on the wafers 200 in the process furnace 202. Such processing will be described later. After the processing, the wafers 200 and the cassette 110 are unloaded to the outside of the housing 111 in reverse sequence of the above sequence.

(3) Configuration of Process Furnace

Figure 2:
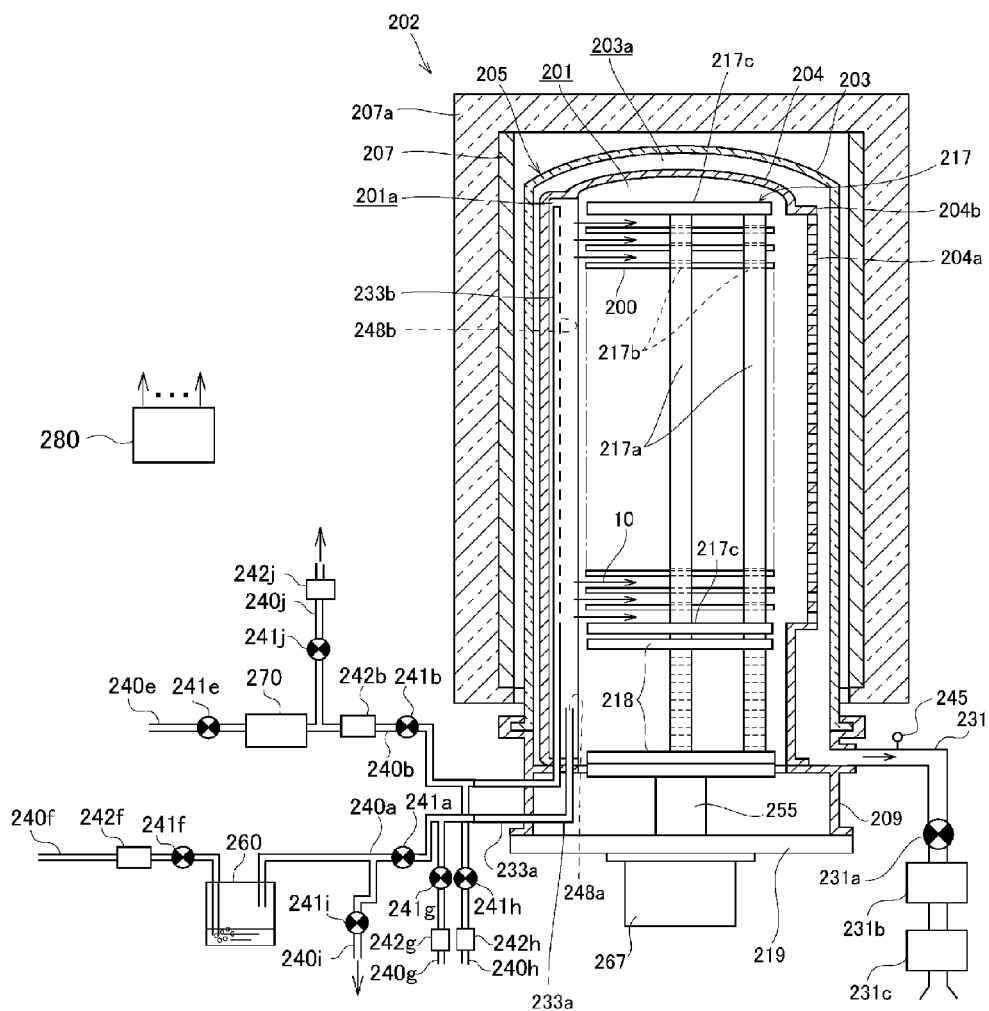
FIG. 2 is a longitudinal cross-sectional view of a process furnace installed at the substrate processing apparatus in accordance with the first embodiment of the present invention.
Figure 3:
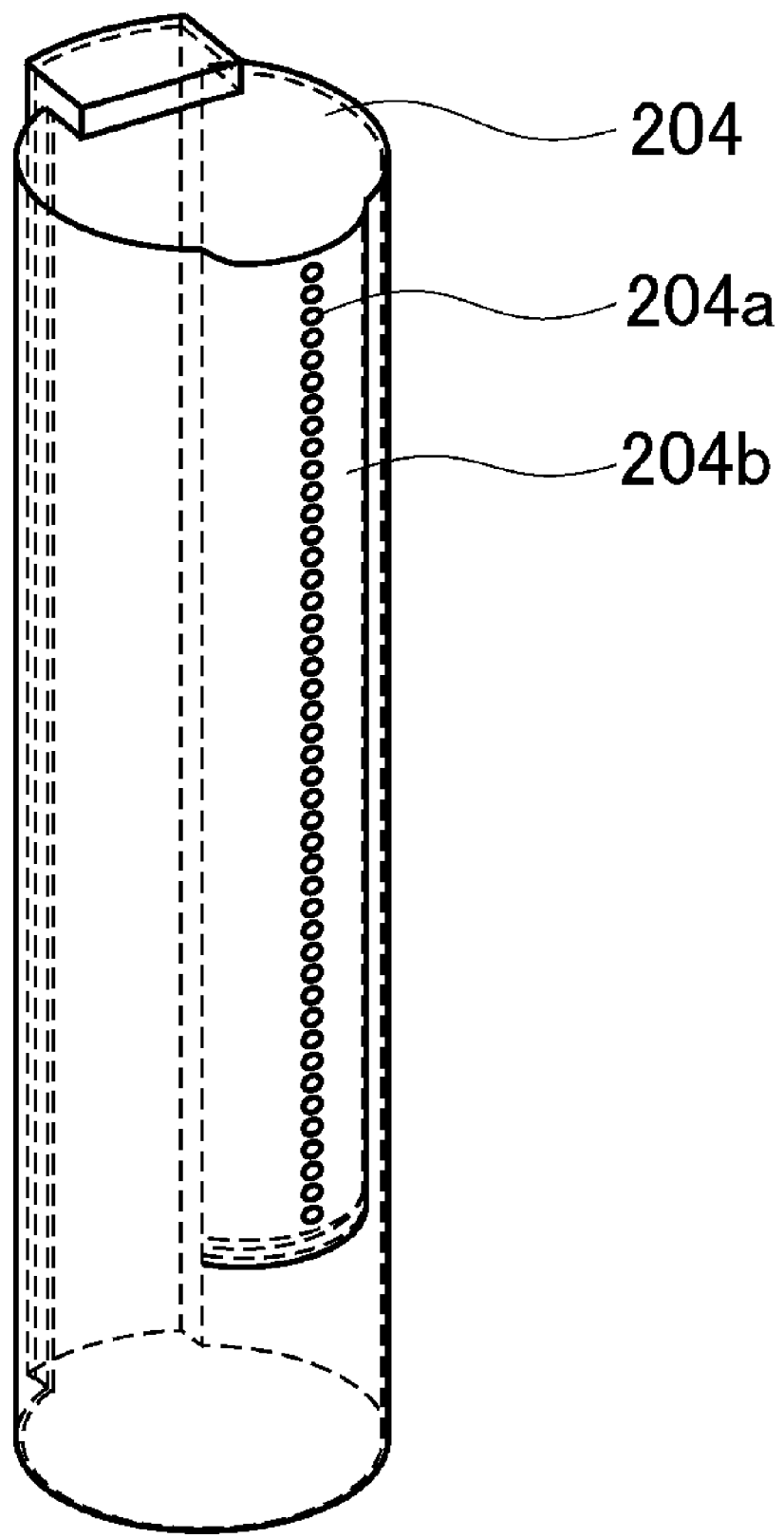
FIG. 3 is a perspective view of an inner tube installed at the substrate processing apparatus in accordance with the first embodiment of the present invention, showing a gas exhaust port having a hole shape.
Figure 4:
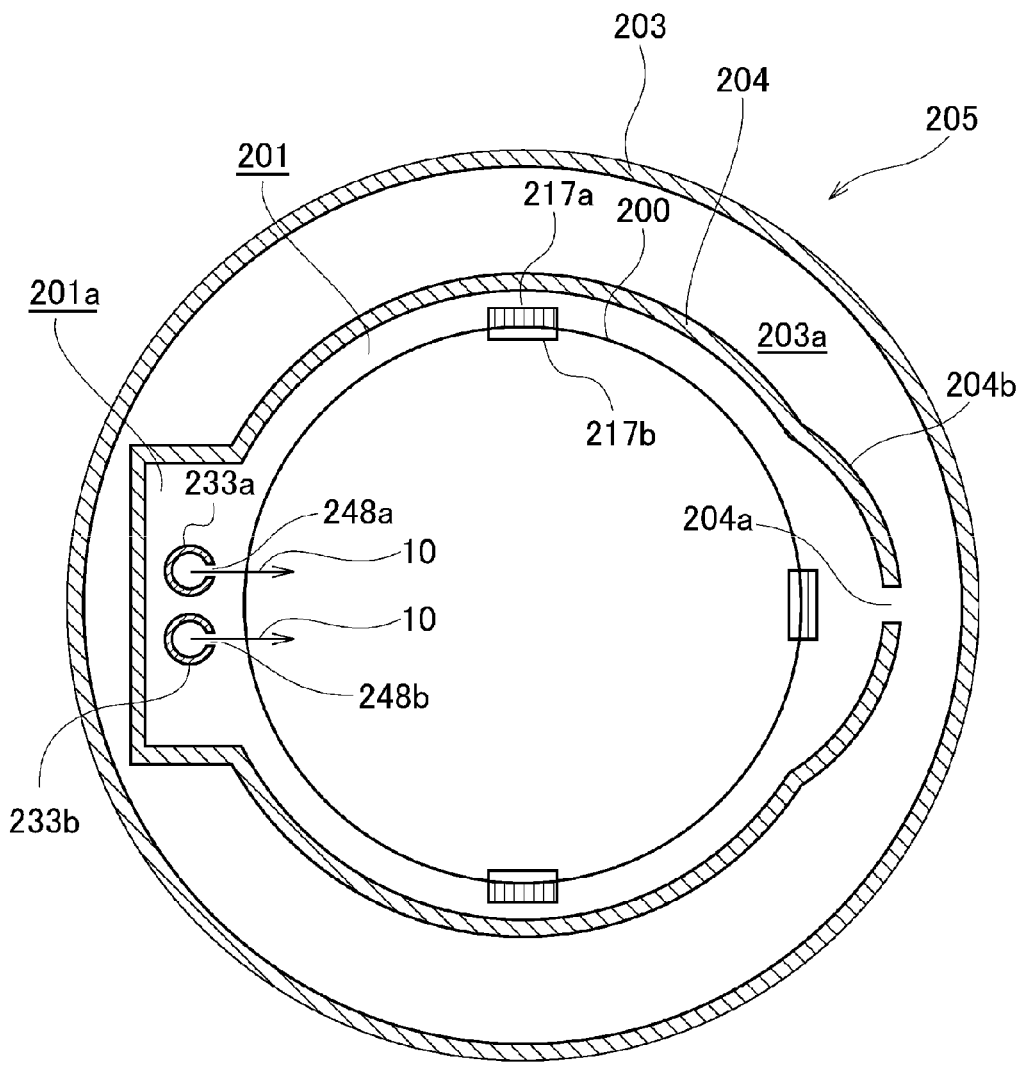
FIG. 4 is a lateral cross-sectional view of a process tube installed at the substrate processing apparatus in accordance with the first embodiment of the present invention, showing a nozzle receiving portion installed in the inner tube.

Next, a configuration of the process furnace 202 in accordance with the embodiment will be described with reference to FIGS. 2 to 4. FIG. 2 is a longitudinal cross-sectional view of the process furnace 202 installed at the substrate processing apparatus in accordance with the embodiment. FIG. 3 is a perspective view of the inner tube 204 installed at the substrate processing apparatus in accordance with the embodiment, showing the case in which a gas exhaust port 204a has a hole shape. FIG. 4 is a lateral cross-sectional view of a process tube 205 installed at the substrate processing apparatus in accordance with the embodiment, showing the case in which a nozzle accommodating portion 201a is installed in the inner tube 204.

(Process Chamber)

The process furnace 202 in accordance with the embodiment includes a process tube 205, which is a reaction tube, and a manifold 209. The process tube 205 is constituted by the inner tube 204 forming a process chamber 201 in an inner space thereof to accommodate the plurality of wafers 200 stacked in a horizontal posture, and an outer tube 203 surrounding the inner tube 204. The inner tube 204 and the outer tube 203 are formed of a non-metal material having heat resistance such as quartz ($SiO_2$) or silicon carbide (SiC), and each tube has an upper end closed and a lower end opened. A portion of a sidewall of the inner tube 204 projects in a diametrical outward direction of the inner tube 204 (toward a sidewall of the outer tube 203), beyond the sidewall of the inner tube 204, along a direction in which the wafers 200 are stacked (in a vertical direction). A space of the process chamber 201 projecting in the diametrical outward direction of the inner tube 204 (toward the sidewall of the outer tube 203) is constituted by the nozzle accommodating portion 201a configured to accommodate a source gas nozzle 233a and a reactive gas nozzle 233b, which will be described later. A manifold 209 is formed of a metal material such as SUS, and has a cylindrical shape with an upper end and a lower end opened. The inner tube 204 and the outer tube 203 are supported by the manifold 209 from a lower end side in a longitudinal direction.

The inner tube 204, the outer tube 203 and the manifold 209 are concentrically disposed. The lower end (the furnace port) of the manifold 209 is configured to be hermetically sealed by the seal cap 219 when the boat elevator 115 is raised. A sealing member (not shown) such as an O-ring configured to hermetically seal the inside of the inner tube 204 is installed between the lower end of the manifold 209 and the seal cap 219.

The inside of the inner tube 204 (the inside of the process chamber 201) is configured such that the boat 217, which is the substrate holder, is inserted from a lower side thereof. Inner diameters of the inner tube 204 and the manifold 209 are configured to be larger than a maximum outer diameter of the boat 217 in which the wafers 200 are loaded.

The boat 217 includes a pair of end plates 217c, which are vertically disposed, and a plurality of posts 217a (for example, three posts) vertically installed between the pair of end plates 217c. The end plates 217c and the posts 217a are formed of a non-metal material having heat resistance such as quartz or silicon carbide. Each post 217a has a plurality of holders 217b disposed in a longitudinal direction of the post 217a at regular intervals. Each post 217a is disposed such that the holders 217b formed at the posts 217a oppose each other. As outer peripheries of the wafers 200 are inserted into the holders 217b, the plurality of wafers 200 are configured to be held in a substantially horizontal posture in a multi-stage at predetermined intervals (substrate pitches). The boat 217 is mounted on an insulating cap 218 configured to block heat conduction. The insulating cap 218 is supported by a rotary shaft 255 from a lower side thereof. The rotary shaft 255 is installed to hermetically seal the inside of the process chamber 201 and pass through a center portion of the seal cap 219. A rotary mechanism 267 configured to rotate the rotary shaft 255 is installed under the seal cap 219. As the rotary shaft 255 is rotated by the rotary mechanism 267, the boat 217 on which the plurality of wafers 200 are mounted can be rotated with the inside of the process chamber 201 hermetically sealed.

A heater 207, which is a heating unit having a concentric relationship with the process tube 205, is installed at an outer circumference of the process tube 205 (the outer tube 203).

The cylindrical heater 207 is in a cylindrical shape, and supported by a heater base (not shown), which is a holding plate, to be vertically installed. An insulating material 207a is installed at an outer circumference and an upper end of the heater 207. The heater 207 is configured to adjust a conduction quantity based on temperature information detected by a temperature sensor (not shown).

(Gas Nozzle)

The source gas nozzle 233a and the reactive gas nozzle 233b are installed in the nozzle accommodating portion 201a in a circumferential direction of the process chamber 201. Each of the source gas nozzle 223a and the reactive gas nozzle 233b has an L shape with a vertical portion and a horizontal portion. The source gas nozzle 233a is constituted as a short nozzle having a vertical portion disposed at a predetermined position lower than a region in the process chamber 201 in which the wafer 200 is to be accommodated. In addition, the reactive gas nozzle 233b is constituted as a long nozzle having a vertical portion disposed (extending) in the nozzle accommodating portion 201a in a stacking direction of the wafers 200. Horizontal portions of the source gas nozzle 233a and the reactive gas nozzle 233b are installed to pass through the sidewall of the manifold 209.

As described above, the vertical portion of the source gas nozzle 233a is configured to be disposed at a predetermined position lower than the region in the process chamber 201 in which the wafer 20 is to be accommodated. That is, even when a temperature of the region in the process chamber 201 in which the wafer 200 is to be accommodated is higher than a pyrolysis temperature of the source gas, the vertical portion of the source gas nozzle 233a is disposed at the predetermined position in the nozzle accommodating portion 201a under the region in which the wafer 200 is to be accommodated, in order to prevent decomposition of the source gas in the process chamber 201. For example, the vertical portion of the source gas nozzle 233a is disposed at a lower portion in the process chamber 201 and under a space surrounded by the heater 207. A source gas injection port 248a is installed at a downstream end (an upper end) of the source gas nozzle 233a to supply a source gas toward an upper portion in the process chamber 201. As described above, as the source gas nozzle 233a is constituted as a short nozzle, an increase in temperature in the source gas nozzle 233a upon processing of the substrate can be suppressed, and pyrolysis of the source gas in the source gas nozzle 233a can be suppressed.

As described above, the vertical portion of the reactive gas nozzle 233b extends to an upper portion of the nozzle accommodating portion 201a such that the downstream end reaches an upper end of the boat 217. A plurality of reactive gas injection ports 248b are disposed at a side surface of the vertical portion of the reactive gas nozzle 233b at positions (height positions) corresponding to the wafers 200 in the stacking direction (the vertical direction) of the wafers 200. In addition, a diameter of an opening of a reactive gas injection port 248b may be appropriately adjusted to optimize a flow rate distribution or a velocity distribution of the reactive gas in the process chamber 201. The diameter may be equal from a lower portion to an upper portion thereof, or may be gradually increased from the lower portion to the upper portion. As described above, as the reactive gas nozzle 233b is constituted by a porous long nozzle, a supply amount of the reactive gas to the wafers 200 can be uniformized between the wafers 200. In addition, when the reactive gas has a property of being easily pyrolyzed, the reactive gas nozzle 233b may be constituted as the same short nozzle as the source gas nozzle 233a.

(Source Gas Supply Unit)

A downstream end of a source gas supply pipe 240a is connected to an upstream end of the horizontal portion of the source gas nozzle 233a projecting from the sidewall of the manifold 209. A TMA tank 260 configured to evaporate liquid TMA, which is a liquid source material, to generate TMA gas, which is a source gas, is connected to the upstream end of the source gas supply pipe 240a. Specifically, the upstream end of the source gas supply pipe 240a is disposed over a liquid surface of the liquid TMA in the TMA tank 260. An opening/closing valve 241a is installed at the source gas supply pipe 240a. As the opening/closing valve 241a is opened, the TMA gas generated in the TMA tank 260 is supplied into the process chamber 201 via the source gas nozzle 233a. In addition, in order to prevent re-liquidation of the vaporized TMA gas in the pipe, the source gas supply pipe 240a is configured to be heated to, for example, 40° C. to 130° C., and the manifold 209 is configured to be heated to, for example, 40° C. to 150° C.

A downstream end of a carrier gas supply pipe 240f configured to supply a carrier gas such as an inert gas into the TMA tank 260 is connected to an upstream side of the TMA tank 260. Specifically, the downstream end of the carrier gas supply pipe 240f is immersed in the liquid TMA in the TMA tank 260. An upstream end of the carrier gas supply pipe 240f is connected to a carrier gas supply source (not shown) configured to supply an inert gas (a carrier gas) such as argon gas (Ar gas). A flow rate controller (MFC) 242f and an opening/closing valve 241f are sequentially installed at the carrier gas supply pipe 240f from the upstream side thereof. As the opening/closing valve 241f is opened, the carrier gas is supplied into the liquid TMA in the TMA tank 260 so that the liquid TMA bubbles. As the liquid TMA bubbles, TMA gas is generated in the TMA tank 260. As the opening/closing valve 241a is opened, a mixed gas of the TMA gas generated in the TMA tank 260 and the carrier gas is supplied into the process chamber 201 via the source gas supply pipe 240a and the source gas nozzle 233a. As the carrier gas is supplied into the TMA tank 260 to vaporize the liquid TMA, discharge of the TMA gas from the TMA tank 260 and supply of the source gas into the process chamber 201 can be promoted. A supply flow rate of the carrier gas into the TMA gas 260 (i.e., a supply flow rate of the carrier gas into the process chamber 201) can be controlled by a flow rate controller 242f.

A source gas supply unit configured to supply the source gas into the process chamber 201 via the source gas nozzle 233a is mainly constituted by the source gas supply pipe 240a, the TMA tank 260, the opening/closing valve 241a, the carrier gas supply pipe 240f, the carrier gas supply source (not shown), the flow rate controller 242f, and the opening/closing valve 241E (Reactive Gas Supply Unit)

A downstream end of a reactive gas supply pipe 240b is connected to the upstream end of the horizontal portion of the reactive gas nozzle 233b projecting from the sidewall of the manifold 209. An ozonizer 270 configured to generate ozone gas ($O_3$), which is a reactive gas (an oxidizer), is connected to the upstream end of the reactive gas supply pipe 240b. A flow rate controller 242b and an opening/closing valve 241b are sequentially installed at the reactive gas supply pipe 240b from the upstream side thereof. A downstream end of an oxygen gas supply pipe 240e is connected to the ozonizer 270. An upstream end of the oxygen gas supply pipe 240e is connected to an oxygen gas supply source (not shown) configured to supply oxygen ($O_2$) gas. An opening/closing valve 241e is installed at the oxygen gas supply pipe 240e. As the opening/closing valve 241e is opened, oxygen gas is supplied into the ozonizer 270, and as the opening/closing valve 241b is opened, ozone gas generated in the ozonizer 270 is supplied into the process chamber 201 via the reactive gas supply pipe 240b. In addition, a supply flow rate of the ozone gas into the process chamber 201 can be controlled by a flow rate controller 242b.

A reactive gas supply unit configured to supply the ozone gas into the process chamber 201 via the reactive gas nozzle 233b is mainly constituted by the reactive gas supply pipe 240b, the ozonizer 270, the flow rate controller 242b, the opening/closing valve 241b, the oxygen gas supply pipe 240e, the oxygen gas supply source (not shown), and the opening/closing valve 241e.

(Vent Pipe)

An upstream end of a source gas vent pipe 240i is connected to the source gas supply pipe 240a between the TMA tank 260 and the opening/closing valve 241a. A downstream end of the source gas vent pipe 240i is connected to a downstream side (between an APC valve 231a and a vacuum pump 231b) of an exhaust pipe 231, which will be described later. An opening/closing valve 241i is installed at the source gas vent pipe 240i. As the opening/closing valve 241a is closed and the opening/closing valve 241i is opened, in a state in which the source gas is continuously generated in the TMA tank 260, supply of the source gas into the process chamber 210 may be stopped. While a predetermined time is needed to stably generate the source gas, according to a switching operation of the opening/closing valve 241a and the opening/closing valve 241i, supply and stoppage of the source gas into the process chamber 201 can be switched for an extremely short time.

Similarly, an upstream end of a reactive gas vent pipe 240j is connected to the reactive gas supply pipe 240b between the ozonizer 270 and the flow rate controller 242b. A downstream end of the reactive gas vent pipe 240j is connected to a downstream side of the exhaust pipe 231 (between the APC valve 231a and the vacuum pump 231b). An opening/closing valve 241j and an ozone removing apparatus 242j are sequentially installed at the reactive gas vent pipe 240j from an upstream thereof. As the opening/closing valve 241b is closed and the opening/closing valve 241j is opened, in a state in which ozone gas is continuously generated by the ozonizer 270, supply of the ozone gas into the process chamber 201 can be stopped. While a predetermined time is needed to stably generate the ozone gas, according to a switching operation of the opening/closing valve 241b and the opening/closing valve 241j, supply and stoppage of the ozone gas into the process chamber 201 can be switched for an extremely short time.

(Inert Gas Supply Pipe)

A downstream end of a first inert gas supply pipe 240g is connected to the source gas supply pipe 240a at a downstream side of the opening/closing valve 241a. An insert gas supply source (not shown) configured to supply an inert gas such as $N_2$ gas, a flow rate controller (MFC) 242g, and an opening/closing valve 241g are sequentially installed at the first inert gas supply pipe 240g from the upstream side thereof. Similarly, a downstream end of a second inert gas supply pipe 240h is connected to the reactive gas supply pipe 240b at a downstream side of the opening/closing valve 241b. An inert gas supply source (not shown) configured to supply an inert gas such as $N_2$ gas, a flow rate controller (MFC) 242h, and an opening/closing valve 241h are sequentially installed at the second inert gas supply pipe 240h from the upstream side thereof.

The inert gas supplied through the first insert gas supply pipe 240g and the second inert gas supply pipe 240h functions as a dilution gas for diluting a source gas or a reactive gas and a purge gas for purging the inside of the process chamber 201.

For example, as the opening/closing valve 241i is closed and the opening/closing valve 241a and the opening/closing valve 241g are opened, the mixed gas from the TMA tank 260 can be supplied into the process chamber 201 in a state in which the mixed gas is diluted by the inert gas (the dilution gas) from the first inert gas supply pipe 240g. In addition, as the opening/closing valve 242b and the opening/closing valve 241h are opened, the ozone gas from the ozonizer 270 can be supplied into the process chamber 201 in a state in which the ozone gas is diluted by the inert gas (the dilution gas) from the second inert gas supply pipe 240h. As described above, according to dilution by the dilution gas, a concentration of the source gas or the ozone gas supplied into the process chamber 201 can be freely adjusted.

In addition, as the opening/closing valve 241a is closed and the opening/closing valve 241i is opened, supply of the source gas into the process chamber 201 can be stopped in a state in which the source gas is continuously generated by the TMA tank 260, and as the opening/closing valve 241g and the opening/closing valve 241h are opened, the inert gas (the purge gas) can be supplied into the process chamber 201 through the first inert gas supply pipe 240g and the second inert gas supply pipe 240h. Similarly, as the opening/closing valve 241b is closed and the opening/closing valve 241j is opened, supply of the ozone gas into the process chamber 201 is stopped in a state in which the ozone gas is continuously generated by the ozonizer, and as the opening/closing valve 241g and the opening/closing valve 241h are opened, the inert gas (the purge gas) can be supplied into the process chamber 201 through the first inert gas supply pipe 240g and the second inert gas supply pipe 240h. As described above, as the inert gas (the purge gas) is supplied into the process chamber 201, discharge of the source gas, the ozone gas, etc., from the process chamber 201 can be promoted.

(Gas Exhaust Portion and Gas Exhaust Port)

A gas exhaust portion 204b constituting part of the sidewall of the inner tube 204 is installed at the side wall of the the inner tube 204 in a direction in which the wafers 200 are stacked. The gas exhaust portion 204b is installed at a position opposite to the nozzle accommodating portion 201a with the wafers 200 accommodated in the process chamber 201 interposed therebetween.

A gas exhaust port 204a is formed at the gas exhaust portion 204b. The gas exhaust port 204a is disposed at a position opposite to the reactive gas injection port 248b (for example, an opposite position of about 180° to the reactive gas injection port 248b) with the wafers 200 interposed therebetween. The gas exhaust port 204a in accordance with the embodiment is in a hole shape, and is disposed at positions (height positions) corresponding to the plurality of wafers 200. Accordingly, a space 203a between the outer tube 203 and the inner tube 204 is in communication with the process chamber 201 via the gas exhaust port 204a.

In addition, a hole diameter of the gas exhaust port 204a can be appropriately adjusted to optimize a flow rate distribution or a velocity distribution of a gas in the process chamber 201. For example, the diameter may be equal from a lower portion to an upper portion thereof, or may be gradually increased from the lower portion to the upper portion.

Further, a height position of a lower end of the gas exhaust portion 204b may correspond to a height position of the lowermost wafer 200 among the wafers 200 loaded into the process chamber 201. Similarly, a height position of an upper end of the gas exhaust portion 204b may correspond to a height position of the uppermost wafer 200 among the wafers 200 loaded into the process chamber 201. This is because, when the gas exhaust portion 204b is installed to a region with no wafer 200, a gas, which will flow between the wafers 200, may flow to the region with wafer 200.

(Exhaust Unit)

An upstream end of the exhaust pipe 231 is connected to the sidewall of the manifold 209. A pressure sensor 245, which is a pressure detector, an automatic pressure controller (APC) valve 231a, which is a pressure regulator, a vacuum pump 231b, which is a vacuum exhaust apparatus, and removal equipment 231c configured to remove a harmful element from an exhaust gas are sequentially installed at the exhaust pipe 231 from the upstream side thereof. As an opening angle of an opening/closing valve of the APC valve 231a is adjusted based on pressure information from the pressure sensor 245 with the vacuum pump 231b operated, the pressure in the process chamber 201 can be maintained at a desired pressure.

An exhaust unit is mainly constituted by the exhaust pipe 231, the pressure sensor 245, the APC valve 231a, the vacuum pump 231b, and the removal equipment 231c.

As described above, the space 203a between the outer tube 203 and the inner tube 204 is in communication with the process chamber 201 via the gas exhaust port 204a. For this reason, in a state in which the source gas and the reactive gas are supplied into the process chamber 201 through the source gas nozzle 233a and the reactive gas nozzle 233b, as the space between the output tube 203 and the inner tube 204 is exhausted by the exhaust unit, a substantially horizontal gas flow 10 toward the gas exhaust port 204a from the source gas injection port 248a and the reactive gas injection port 248b is generated in the process chamber 201. Such a shape will be shown in FIG. 5 using a source gas as an example.

(Controller)

A controller 280, which is a control unit, is connected to the heater 207, the pressure sensor 245, the APC valve 231a, the vacuum pump 231b, the removal equipment 231c, the rotary mechanism 267, the boat elevator 115, the opening/closing valves 241a, 241b, 241e, 241f, 241g, 241h, 241i and 241j, the flow rate controllers 242b, 242f, 242g and 242h, the TMA tank 260, the ozonizer 270, the ozone removal apparatus 242j, the temperature sensor (not shown), and so on. A temperature control operation of the heater 207, an opening/closing and pressure regulation operation of the APC valve 231a, start and stop of the vacuum pump 231b, rotational velocity adjustment of the rotary mechanism 267, an elevation operation of the boat elevator 115, opening/closing operations of the opening/closing valves 241a, 241b, 241e, 241f, 241g, 241h, 241i and 241j, flow rate regulation of the flow rate controllers 242b, 242f, 242g and 242h, and so on, are controlled by the controller 280.

(4) Substrate Processing Process

Figure 7A:
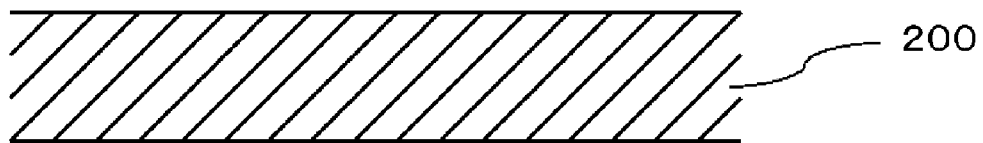
FIGS. 7A to 7D are cross-sectional views schematically showing a shape of an aluminum oxide film formed on a wafer.

Next, a substrate processing process in accordance with the embodiment will be described with reference to the drawings. FIG. 6 is a flowchart of the substrate processing process in accordance with the embodiment. FIG. 7A is a cross-sectional view schematically showing a shape in which an aluminum oxide film (an AlO film) 500 is formed on the wafer 200. FIG. 8 is a view schematically illustrating gas supply in accordance with the embodiment. FIG. 9 is a timing chart according to a gas supply in accordance with the substrate processing process of the embodiment. In addition, in this embodiment, a method of forming a predetermined film, i.e., an aluminum oxide film 500, as a high-k film on the wafer 200 through an ALD method using TMA gas as a source gas and ozone gas as a reactive gas will be exemplarily described. Here, the ALD method is performed as one process of a manufacturing process of a semiconductor device. In addition, in the following description, an operation of each part constituting the substrate processing apparatus 201 is controlled by the controller 280.

In the substrate processing process in accordance with the embodiment, as shown in FIG. 6, a substrate loading process S10, a pressure decrease/temperature increase process S20, an aluminum oxide film forming process S30, an atmospheric pressure returning process S40, and a substrate unloading process S50 are performed.

[Substrate Loading Process S10]

First, the plurality of wafers 200 are loaded on the boat 217 (wafer charging). Then, the boat 217 on which the plurality of wafers 200 are held is raised by the boat elevator 115 to be accommodated into the process chamber 201 (boat loading). In this state, the seal cap 219 hermetically seals the lower end of the manifold 209 via the O-ring (not shown). In addition, upon the wafer charging and the boat loading, the opening/closing valve 241g and the opening/closing valve 241h are opened, and the purge gas is continuously supplied into the process chamber 201.

[Pressure Decrease/Temperature Increase Process S20]

Then, the opening/closing valve 241g and the opening/closing valve 241h are closed, and the inside of the process chamber 201 is exhausted by the vacuum pump 231b to a desired processing pressure (a level of vacuum). At this time, an opening angle of the APC valve 231a is feedback-controlled based on pressure information measured by the pressure sensor 245. In addition, a conduction quantity to the heater 207 is adjusted such that the surface of the wafer 200 reaches a desired processing temperature. At this time, a conduction state to the heater 207 is feedback-controlled based on temperature information detected by the temperature sensor (not shown). In addition, rotation of the boat 217 and the wafer 200 is initiated by the rotary mechanism 267. Further, temperature control, pressure regulation, and rotation of the wafer 200 are continued until the aluminum oxide film forming process S30 is terminated.

Furthermore, conditions in the process chamber 201 upon pressure/temperature stabilization are exemplarily described, for example:

Processing pressure: 1 to 100 Pa, preferably 40 Pa, and

Processing temperature: 450° C. to 650° C., preferably 550° C.

[Aluminum Oxide Film Forming Process S30]

Next, an aluminum oxide film 500, which is a high-k film, is formed on the wafer 200 to a desired thickness (see FIG. 7).

[Source Gas Supply Process S31]

First, the opening/closing valve 214f is opened to supply Ar gas, which is a carrier gas, into the TMA tank 260 such that liquid TMA in the TMA tank 260 bubbles. Accordingly, the liquid TMA in the TMA tank 260 is evaporated to generate TMA gas, which is a source gas. Until the TMA gas is stably generated, in a state in which the opening/closing valve 241a is closed, the opening/closing valve 241i is opened, and a mixed gas of the TMA gas and the Ar gas is discharged through the source gas vent pipe 240i. In addition, generation of the TMA gas may be performed simultaneously with the pressure decrease/temperature increase process S20 (preliminary evaporation) so that a generation amount of the TMA gas is stabilized upon completion of the pressure decrease/temperature increase process S20.

When the TMA gas is stably generated, the opening/closing valve 241i is closed and the opening/closing valve 241a is opened, and supply of the mixed gas of the TMA gas and the Ar gas into the process chamber 201 via the source gas nozzle 233a is initiated. At this time, the opening/closing valve 241g may be opened and the $N_2$ gas (the dilution gas) may be supplied through the first inert gas supply pipe 240g so that the TMA gas is diluted in the process chamber 201. In addition, the mixed gas may be compressively discharged by the $N_2$ gas supplied through the first inert gas supply pipe 240g, and supply of the mixed gas into the process chamber 201 may be promoted ($N_2$ push).

Figure 7B:
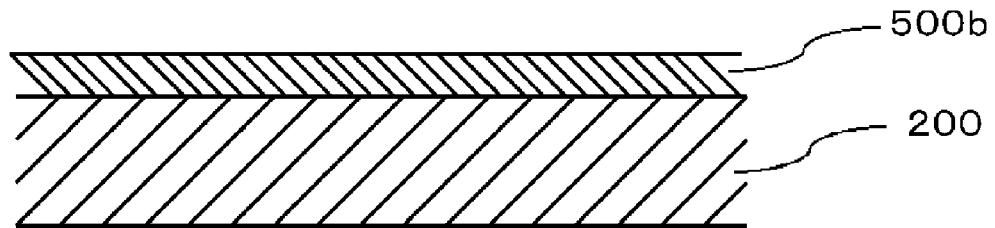

The mixed gas supplied into the process chamber 201 through the source gas nozzle 233a is, as shown in FIG. 8, supplied from the wafer 200 at a lower end side of the boat 217 to the wafer 200 at an upper end side thereof. In addition, as shown in FIG. 5, the mixed gas supplied into the process chamber 201 passes over the wafer 200 to become a gas flow 10 in a substantially horizontal direction toward the gas exhaust port 204a, and is exhausted through the exhaust pipe 231 via the gas exhaust port 204a. At this time, a portion of the TMA gas supplied onto the stacked wafers 200 causes chemisorption (surface reaction) with a surface such as a surface of the wafer 200 or a surface of an adsorption layer of TMA molecules already adsorbed on the wafer 200, forming an adsorbed layer or an Al layer of the TMA molecules on the wafer 200. In addition, the TMA gas supplied onto the wafer 200 is partially pyrolyzed to generate a CVD reaction as well as an ALD reaction, and forms an Al layer including bonding between aluminum atoms (Al—Al bonding) on the wafer 200. Here, the adsorption layer of the TMA molecules includes a discontinuous adsorption layer and a continuous layer constituted by overlapping discontinuous layers, in addition to an adsorption layer in which the TMA molecules are continuously adsorbed. In addition, the Al layer includes a discontinuous layer and a continuous layer constituted by overlapping discontinuous layers, in addition to a continuous layer constituted by Al. Meanwhile, Al is an element that becomes a solid material on its own. Hereinafter, the adsorption layer of the TMA molecules and the Al layer formed on the wafer 200 are also referred to as an Al-containing layer 500a. FIG. 7B shows a shape of the Al-containing layer 500a formed on the wafer 200.

After supply of the mixed gas is continued for a predetermined time, in a state in which the opening/closing valve 241a is closed and the opening/closing valve 241i is opened to continuously generate the TMA gas, supply of the TMA gas into the process chamber 201 is stopped. In addition, in a state in which the opening/closing valve 241f is opened, supply of the Ar gas into the TMA tank 260 is continued.

[Exhaust Process S32]

Next, in a state in which the opening/closing valves 241a and 241b are closed, the opening/closing valve 241g and the opening/closing valve 241h are opened to supply the $N_2$ gas (the purge gas) to purge the inside of the process chamber 201, and the inside of the process chamber 201 is exhausted to remove the TMA gas (a remaining gas) remaining in the process chamber 201. When a predetermined time elapses and the atmosphere in the process chamber 201 is substituted (purged) by the $N_2$ gas, the opening/closing valve 241g and the opening/closing valve 241h are closed to stop supply of the $N_2$ gas into the process chamber 201. As the exhaust process S32 is performed, as shown in FIG. 9, mixing of the TMA gas supplied in the source gas supply process S31 and the ozone gas supplied in the reactive gas supply process S33, which will be described below, can be prevented. In addition, the purging may be repeated a predetermined number of times (purge cycle). In this case, the TMA gas, etc., remaining in the process chamber 201 can be more securely removed.

[Reactive Gas Supply Process S33]

The ozone gas, which is a reactive gas, is supplied into the process chamber 201 to oxidize the Al-containing layer 500a on the wafer 200. First, the opening/closing valve 241e is opened to supply oxygen gas into the ozonizer 270, generating the ozone gas (an oxidizing agent), which is a reactive gas. Until the ozone gas is stably generated, in a state in which the opening/closing valve 241b is closed, the opening/closing valve 241j is opened to discharge the ozone gas through the reactive gas vent pipe 240j. In addition, generation of the ozone gas may be performed simultaneously with the pressure decrease/temperature increase process S20 so that a generation amount of the ozone gas is stabilized upon completion of the pressure decrease/temperature increase process S20.

When the ozone gas is stably generated, the opening/closing valve 241j is closed and the opening/closing valve 241b is opened to initiate supply of the ozone gas into the process chamber 201 via the reactive gas nozzle 233b. At this time, the opening/closing valve 241g may be opened to supply the $N_2$ gas (the dilution gas) through the second inert gas supply pipe 240h, diluting the ozone gas in the reactive gas nozzle 233b. In addition, the ozone gas may be compressively discharged by the $N_2$ gas supplied through the second inert gas supply pipe 240h to promote supply of the ozone gas into the process chamber 201 ($N_2$ push).

Figure 5:
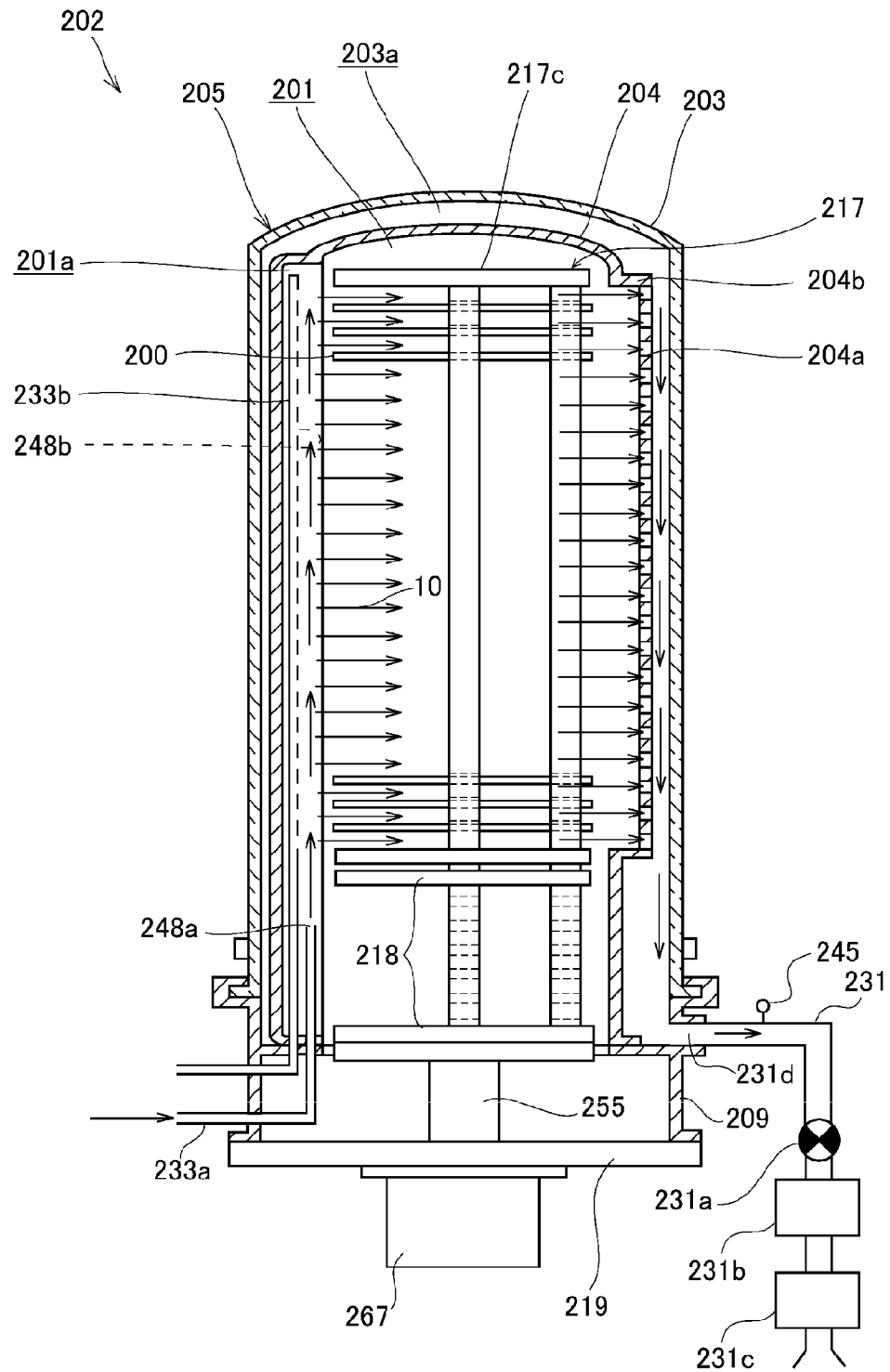
FIG. 5 is a schematic view showing a gas flow generated in the process tube installed at the substrate processing apparatus in accordance with the first embodiment of the present invention.
Figure 7C:
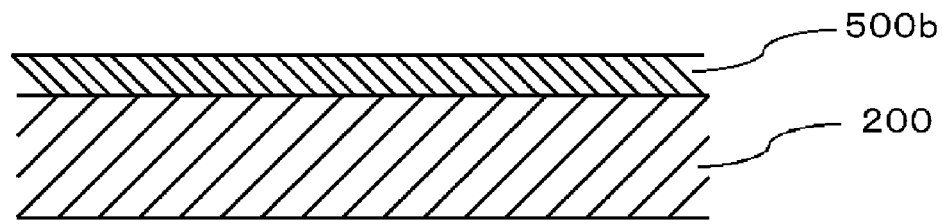

Similar to the source gas shown in FIG. 5, the ozone gas supplied into the process chamber 201 through the reactive gas nozzle 233b becomes a gas flow 10 in a horizontal direction toward the gas exhaust port 204a from the reactive gas injection port 248b, and is discharged through the exhaust pipe 231. At this time, the ozone gas supplied to the stacked wafers 200 contacts the Al-containing layers 500a on the wafers 200 to oxidize the wafers 200. FIG. 7C shows a shape of an aluminum oxide layer 500b formed on the wafer 200.

After the ozone gas is supplied for a predetermined time, the opening/closing valve 241b is closed and the opening/closing valve 241j is opened to stop supply of the ozone gas into the process chamber 201 in a state in which the ozone gas is continuously supplied.

[Exhaust Process S34]

Next, according to the same sequence and processing conditions as the exhaust process S32, the ozone gas (remaining gas) remaining in the process chamber 201 is removed. As the exhaust process S34 is performed, as shown in FIG. 9, mixing of the ozone gas supplied in the reactive gas supply process S33 and the TMA gas supplied in the source gas supply process S31 of the next cycle can be prevented.

Figure 7D:
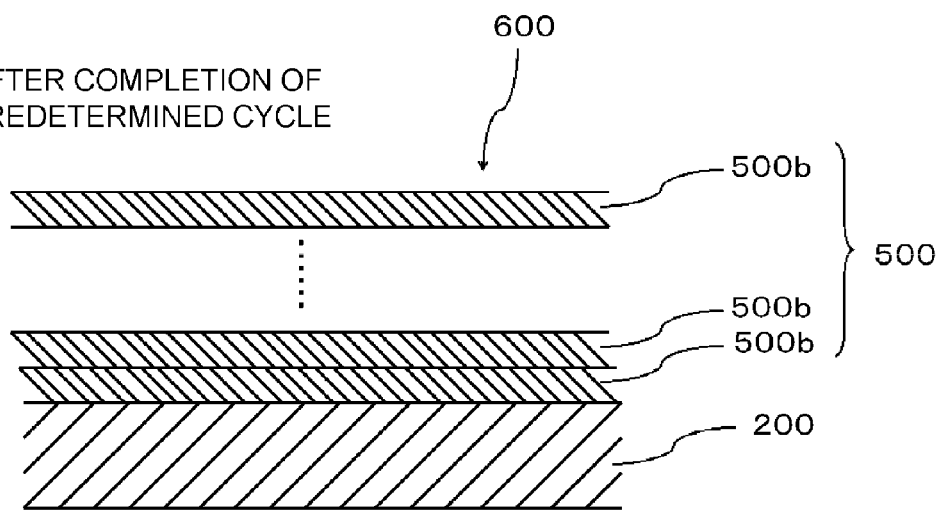

Thereafter, the source gas supply process S31 to the exhaust process S34 are set as one cycle, and the cycle is performed a predetermined number of times to stack the aluminum oxide layers 500b, forming the aluminum oxide film 500 on the wafer 200 to a desired thickness (see FIG. 7D). A film thickness of the aluminum oxide film 500 can be controlled by adjusting the number of cycles. In addition, processing conditions of each process will be represented as follows.

<Processing conditions of Source Gas Supply Process S31>

Processing pressure: 50 to 150 Pa, preferably 100 Pa

Flow rate of carrier gas (Ar gas): 0.1 to 2 slm, preferably 0.5 slm,

Processing temperature: 450° C. to 650° C., preferably 550° C.,

Processing time: 5 to 20 seconds, preferably 10 seconds, and

Flow rate of dilution gas ($N_2$ gas): 10 to 20 slm, preferably 17 slm

<Processing conditions of Reactive Gas Supply Process S33>

Processing pressure: 50 to 200 Pa, preferably 70 Pa,

Flow rate of reactive gas (ozone gas): 3 to 20 slm, preferably 6 slm,

Flow rate of dilution gas ($N_2$ gas): 0 to 2 slm, preferably 0.5 slm,

Processing temperature: 450° C. to 650° C., preferably 550° C., and

Processing time: 10 to 60 seconds, preferably 20 seconds

<Processing conditions of Exhaust Process S32 and S34>

Processing pressure: 50 to 200 Pa, preferably 100 Pa,

Flow rate of purge gas ($N_2$ gas) (first inert gas supply pipe): 1 to 10 slm, preferably 5 slm, Flow rate of purge gas ($N_2$ gas) (second inert gas supply pipe): 1 to 10 slm, preferably 5 slm, Processing temperature: 450° C. to 650° C., preferably 550° C., and Processing time: 5 to 60 seconds, preferably 10 seconds

[Atmospheric Pressure Returning Pressure S40]

After the aluminum oxide film 500 is formed on the wafer 200 to a desired thickness, an opening angle of the APC valve 231a is reduced and the opening/closing valves 241g and 241h are opened, and the $N_2$ gas (the purge gas) is supplied into the process chamber 210 until the pressure in the process tube 205 (in the process chamber 201 and in the outer tube 203) reaches an atmospheric pressure.

[Substrate Unloading Process S50]

Next, in a reverse sequence of the substrate loading process S10, the boat 217 is unloaded from the process chamber 201 (boat unloading), and the film-formed wafer 200 is discharged from the boat 217 (wafer discharging). In addition, upon the boat unloading and wafer discharging, the opening/closing valve 241g and the opening/closing valve 241h are opened to continuously supply the purge gas into the process chamber 201.

Thereafter, with respect to the wafer 200 having the aluminum oxide film 500 formed thereon, for example, a process of forming a conductive layer such as an interconnection or an electrode, a process of forming other insulating films, a heat treatment process, and so on, are sequentially performed to form a semiconductor device having the aluminum oxide film 500.

(5) Effects of the Embodiment

According to the embodiment, one or more effects will be provided as follows.

(a) The vertical portion of the source gas nozzle 233a in accordance with the embodiment is configured to be disposed at a predetermined position lower than a region in the process chamber 201 in which the wafer 200 is to be accommodated. According to the configuration, since an increase in temperature in the source gas nozzle 233a can be suppressed even when the processing temperature is increased, pyrolysis of the TMA gas in the source gas nozzle 233a can be suppressed. Accordingly, a CVD reaction between aluminum atoms in the source gas nozzle 233a can be suppressed. Accumulation of reaction products or decomposed matters of the TMA gas on the inner wall of the source gas nozzle 233a can be suppressed, and clogging of the source gas nozzle 233a can be suppressed.

(b) In addition, in accordance with the embodiment, since the reaction products or decomposed matters cannot be easily accumulated on the source gas nozzle 233a and a flow path of the TMA gas cannot be easily narrowed, the TMA gas can be supplied into the process chamber 201 at a stable flow rate and flow velocity.

(c) Further, in accordance with the embodiment, since the processing temperature can be increased to perform the substrate processing, remaining carbon atoms or hydrogen atoms constituting the TMA gas in the aluminum oxide film 500 can be suppressed, and an amount of impurities in the aluminum oxide film 500 can be reduced. Accordingly, a decrease in permittivity due to the impurities can be suppressed, and a leak current can be reduced, improving functions of a high-k film.

(d) Furthermore, in accordance with the embodiment, when the decomposed matters cannot be easily accumulated on the source gas nozzle 233a, a cleaning cycle of the source gas nozzle 233a can be lengthened. Accordingly, since a time for stopping the substrate processing apparatus 101 due to maintenance is reduced, the substrate processing apparatus 101 can be effectively operated to improve productivity. In addition, when the decomposed matters are accumulated, the source gas nozzle 233a may be damaged due to a difference in thermal stress between the source gas nozzle 233a and the decomposed matters. However, in accordance with the embodiment, damage to the source gas nozzle 233a does not easily occur.

Figure 17:
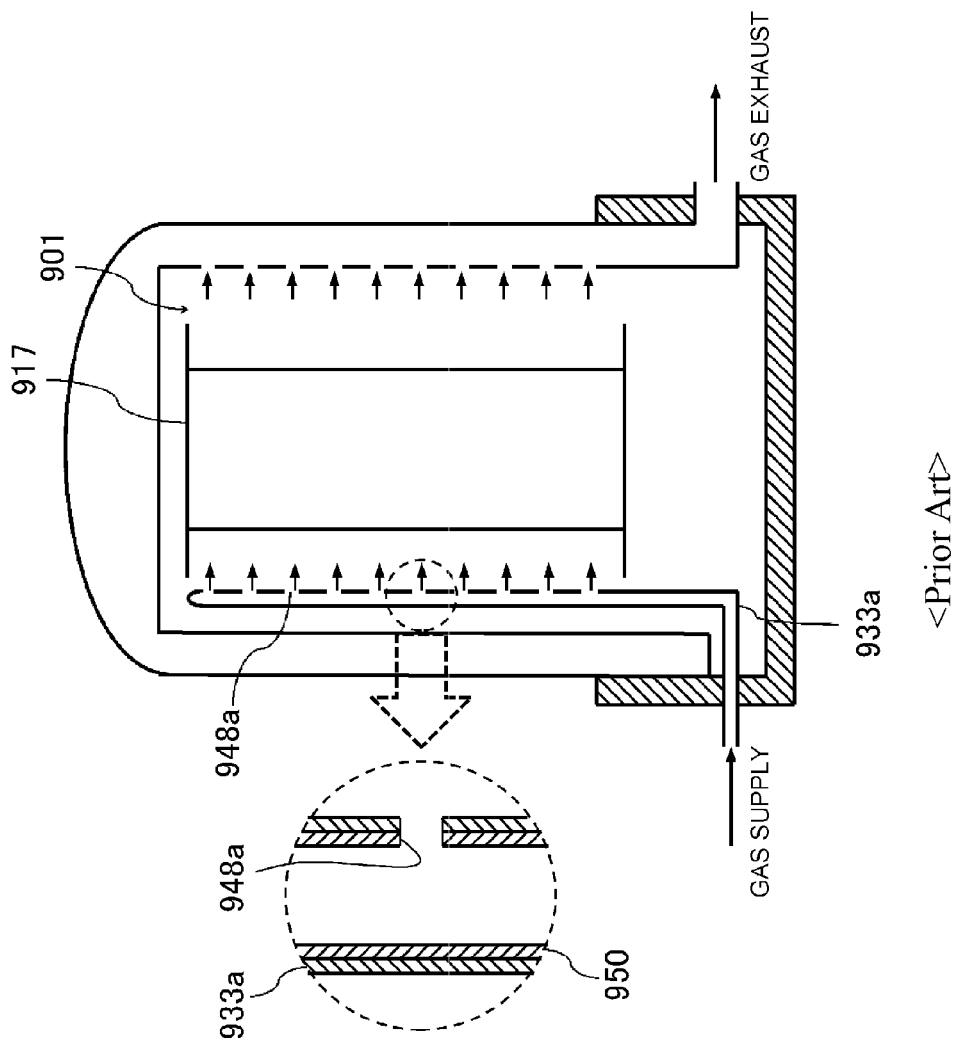
FIG. 17 is a cross-sectional view schematically showing a conventional substrate processing apparatus and a source gas nozzle, in which reaction products or decomposed matters are accumulated.

Here, in order to compare a conventional substrate processing apparatus with the substrate processing apparatus 101 of the embodiment, a configuration of a source gas nozzle of the conventional substrate processing apparatus will be described in brief. FIG. 17 is a cross-sectional view schematically showing a conventional substrate processing apparatus and a source gas nozzle 933a on which decomposed matters 950 are accumulated.

Figure 19A:
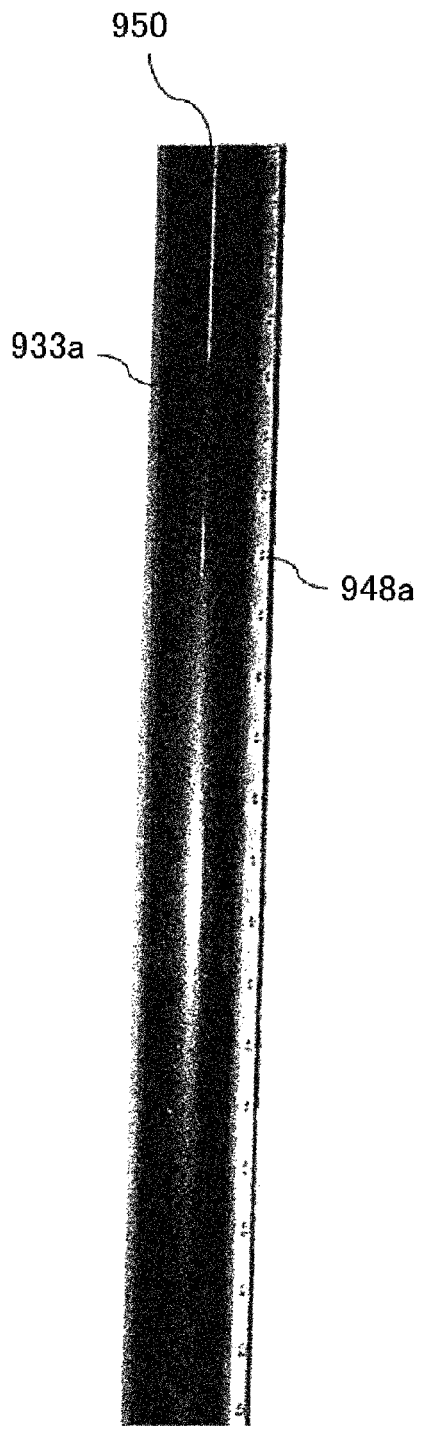
FIGS. 19A and 19B are views for explaining an example of a source gas nozzle in which decomposed matters are accumulated.
Figure 19B:
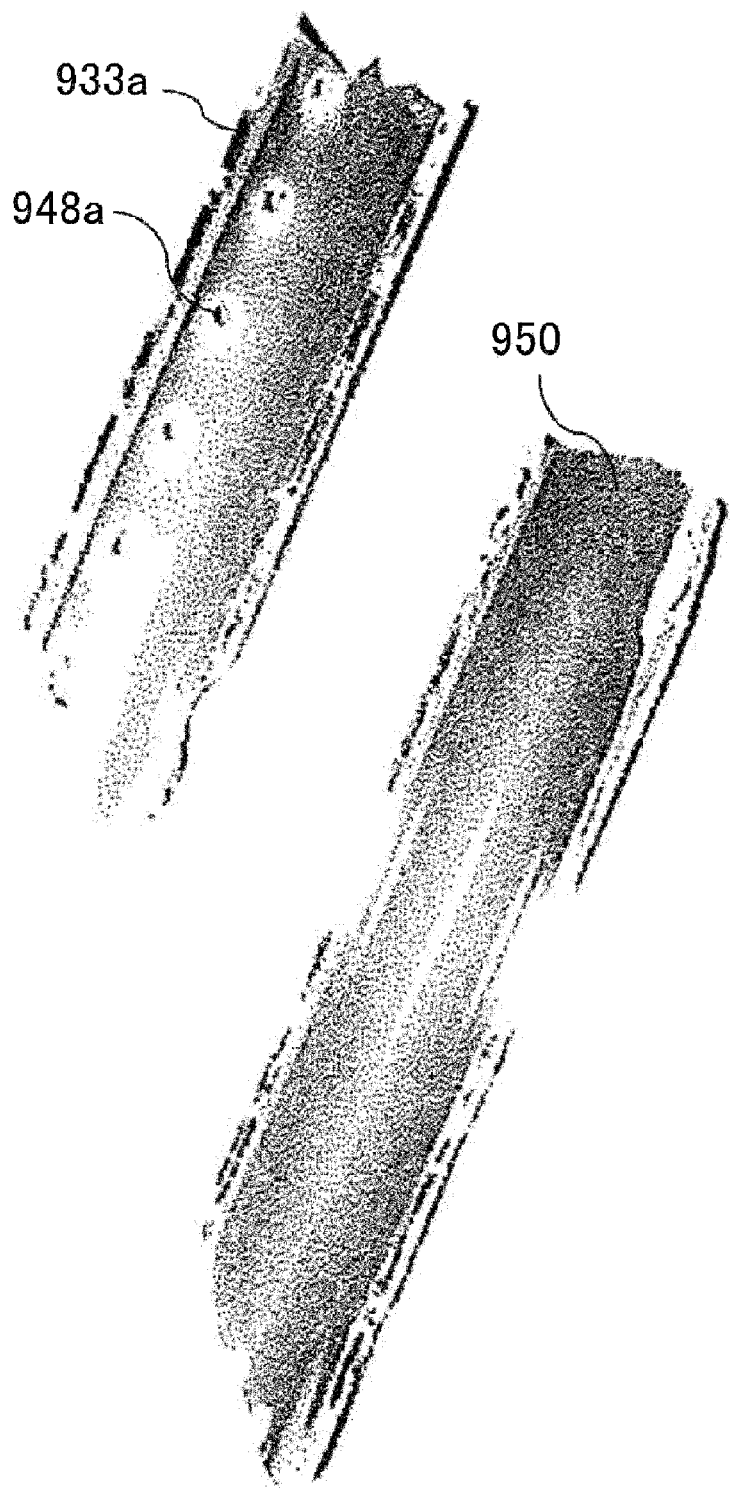
Figure 20A:
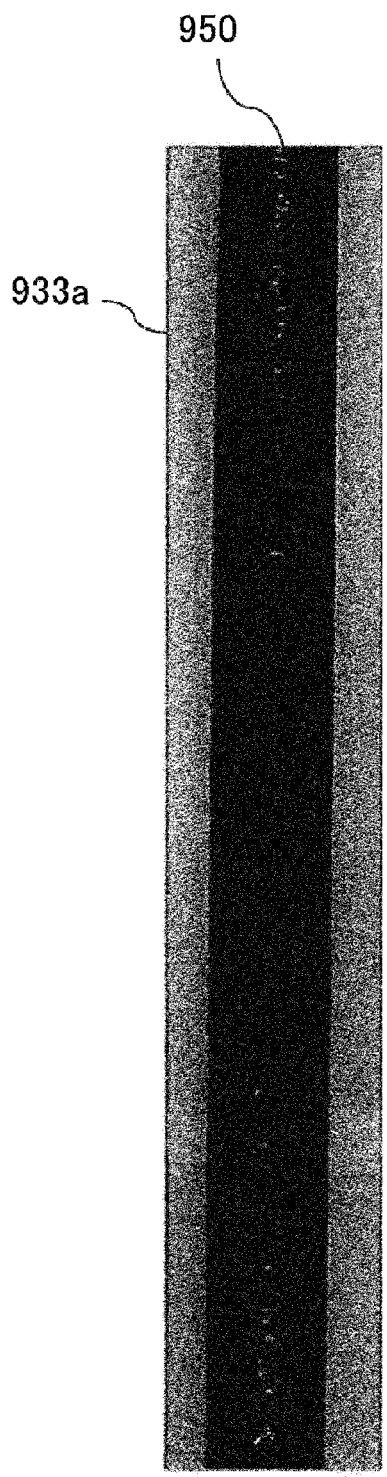
Figure 20B:
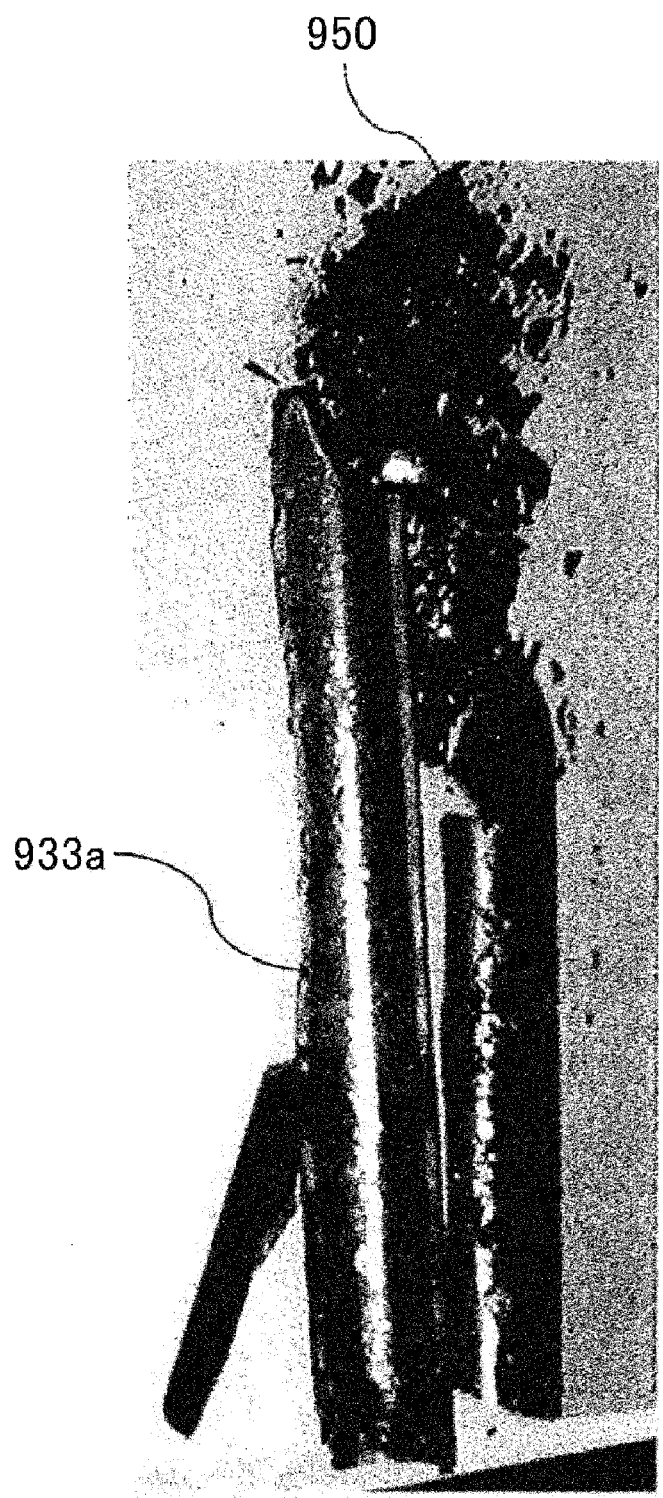

FIGS. 19A, and 19B are views for explaining examples of the source gas nozzle 933a on which the decomposed matters 950 are accumulated. As shown in FIG. 17, the conventional substrate processing apparatus has a configuration in which the source gas nozzle 933a having a plurality of source gas injection ports 948a extends to around an upper end of a boat 917. In addition, a vertical portion of the source gas nozzle 933a is installed in a space surrounded by a heater (not shown) in a process chamber 901. For this reason, when the substrate is processed, a temperature in the source gas nozzle 933a may be increased higher than a pyrolysis temperature of the TMA gas, and thus, the TMA gas may be pyrolyzed before supply of the TMA gas into the process chamber 901. In addition, as shown in FIG. 17, the decomposed matters 950 generated by the TMA gas may be accumulated on an inner wall of the source gas nozzle 933a. Specific examples of the source gas nozzle 933a in which the decomposed matters 950 are accumulated are shown in FIGS. 19A and 19B, respectively. In addition, when the substrate processing is decreased such that the source gas is not pyrolyzed in the source gas nozzle 933a, carbon atoms or hydrogen atoms contained in the source gas molecules in the formed thin film may remain, increasing an amount of impurities in the thin film. In accordance with the embodiment, since the source gas nozzle 233a is constituted as a short nozzle to relatively increase the processing temperature, these problems can be solved.

<Second Embodiment of the Invention>

In the first embodiment, the source gas nozzle 233a was constituted by a short nozzle in which a vertical portion was disposed lower than the region in which the wafer 200 was to be accommodated, not the porous long nozzle like the reactive gas nozzle 233b. However, when the source gas nozzle 233a is constituted by the short nozzle, while pyrolysis of the source gas in the source gas nozzle 233 can be suppressed, a supply amount of the TMA gas may be locally uneven in the process chamber 201 (between the wafers 200). For example, the supply amount of the TMA gas to the wafer 200 at each cycle may be increased at the wafer 200 at an upper side in the process chamber 201 and decreased at the wafer 200 at a lower side therein. As a result, a film thickness of the aluminum oxide film 500 formed on the wafer 200 may be uneven between the wafers 200.

A difference in film thickness between the wafers 200 is likely to increase particularly when the processing temperature is increased to reduce the amount of impurities in the aluminum oxide film 500. This may be because, when the processing temperature is increased, a CVD reaction occurs in the process chamber 210 as well as an ALD reaction. As described above, when the processing temperature is increased, a portion of the TMA gas supplied to each wafer 200 is partially pyrolyzed to generate the CVD reaction as well as the ALD reaction, forming an Al layer including bonding between aluminum atoms on the wafer 200. A thickness of the Al layer formed by the CVD reaction largely depends on the supply amount of the TMA gas, unlike the case of the ALD reaction self-limited by saturation of adsorption of gas molecules. For this reason, when the supply amount of the TMA gas is locally uneven in the process chamber 201, the thickness of the Al-containing layer 500a, i.e., the film thickness of the aluminum oxide film 500, also becomes uneven.

Here, in this embodiment, as a plurality of processes of supplying the TMA gas at different flow velocities are provided in the same cycle, while the source gas nozzle 233a is constituted as the short nozzle, a local difference of the supply amount of the TMA gas in the process chamber 201 (between the wafers 200) is reduced. Specifically, as supply of the TMA gas into the process chamber 201 at a first flow velocity and supply of the TMA gas into the process chamber 201 at a second flow velocity different from the first flow velocity are sequentially performed, the local difference of the supply amount of the TMA gas between the wafers 200 is reduced. For example, when a process of locally supplying the TMA gas mainly to the wafer 200 at the lower side in the process chamber 201 at the first flow velocity and a process of locally supplying the TMA gas mainly to the wafer 200 at the upper side in the process chamber 201 at the second flow velocity greater than the first flow velocity are sequentially performed in the cycle, the supply amount of the TMA gas can be further uniformized between the wafers 200 in one whole cycle. That is, in the embodiment, rather than supplying the TMA gas evenly to all the wafers 200 through one source gas supply process, the TMA gas is locally supplied to a selected portion of the wafers 200 through one source gas supply process, and then, the flow velocity of the TMA gas is varied to change a position to which the TMA gas is mainly supplied, so that the plurality of source gas supply processes are sequentially performed at each cycle, reducing a local difference of the supply amount of the TMA gas.

Hereinafter, the embodiment will be described. In addition, overlapping description with the first embodiment will be appropriately omitted.

(1) Configuration of Process Furnace

The controller 280 in accordance with the embodiment is configured to perform a cycle including a process of supplying a source gas into the process chamber 201*a* predetermined number of times so that the gases are not mixed due to different flow velocities. For example, the controller 280 is configured to perform the cycle including a process of supplying the TMA gas mainly to the wafer 200 at the lower side in the process chamber 201 at the first flow velocity and a process of supplying the TMA gas mainly to the wafer at the upper side in the process chamber at the second flow velocity greater than the first flow velocity a predetermined number of times.

In order to change the flow velocity of the TMA gas from the first flow velocity to the second flow velocity, for example, while uniformly maintaining a flow rate of the TMA gas, which is a source gas, and a flow rate of the Ar gas, which is a carrier gas, a flow rate of the $N_2$ gas supplied through the first inert gas supply pipe 240*g* may be varied. Specifically, as the flow rate of the $N_2$ gas supplied through the first inert gas supply pipe 240*g* is increased, the flow velocity can be increased without changing the flow rate of the TMA gas. In addition, as the flow rate of the $N_2$ gas supplied through the first inert gas supply pipe 240*g* is decreased, the flow velocity can be reduced without changing the flow rate of the TMA gas. As described above, in the embodiment, the inert gas supplied through the first inert gas supply pipe 240*g* functions as a flow velocity adjusting gas for varying a flow velocity of the TMA gas supplied into the process chamber 201 in addition to functioning as the dilution gas and the purge gas.

(2) Substrate Processing Process

Figure 10:
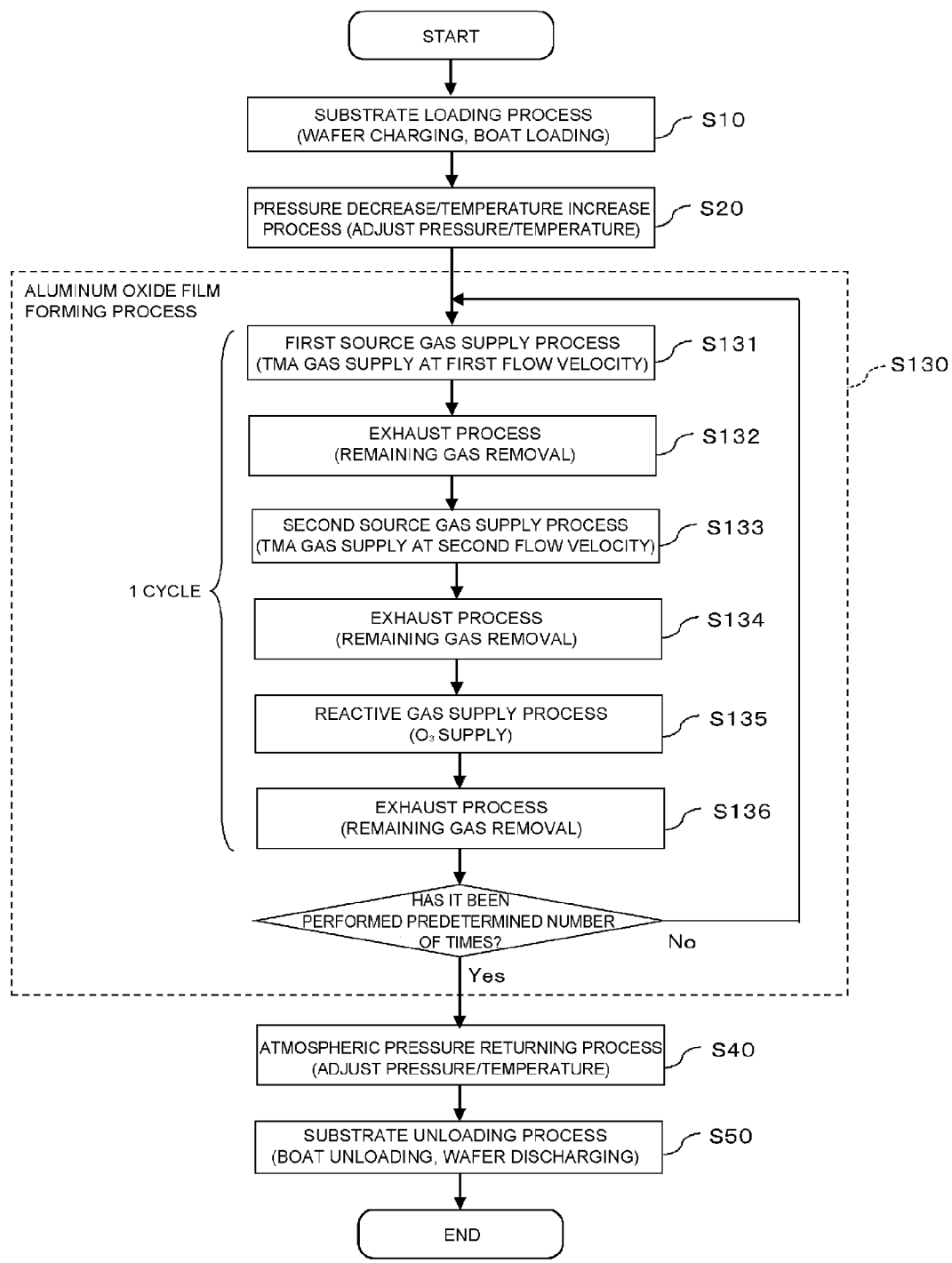
FIG. 10 is a flowchart of a substrate processing process in accordance with a second embodiment of the present invention.
Figure 11A:
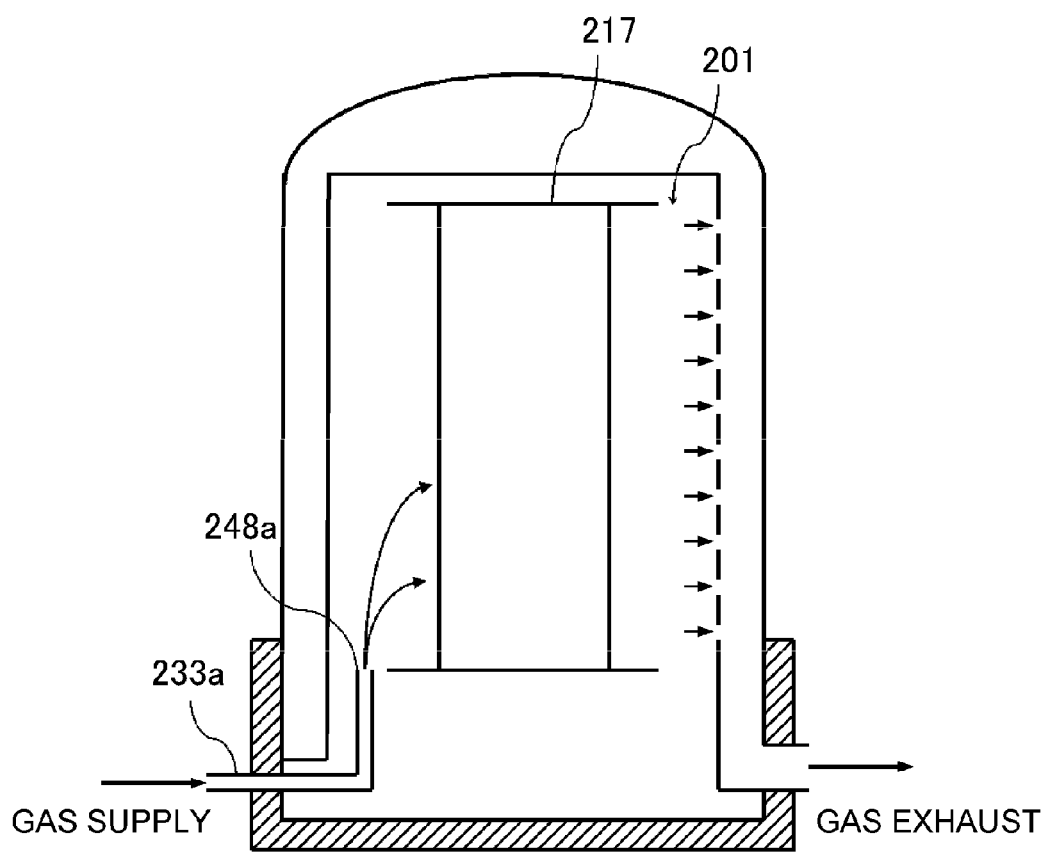
FIGS. 11A and 11B are views schematically showing a source gas supply flow in accordance with the second embodiment of the present invention, FIG. 11A showing the case in which a flow velocity of the source gas is a first flow velocity, and FIG. 11B showing the case in which the flow velocity of the source gas is a second flow velocity greater than the first flow velocity.
Figure 11B:
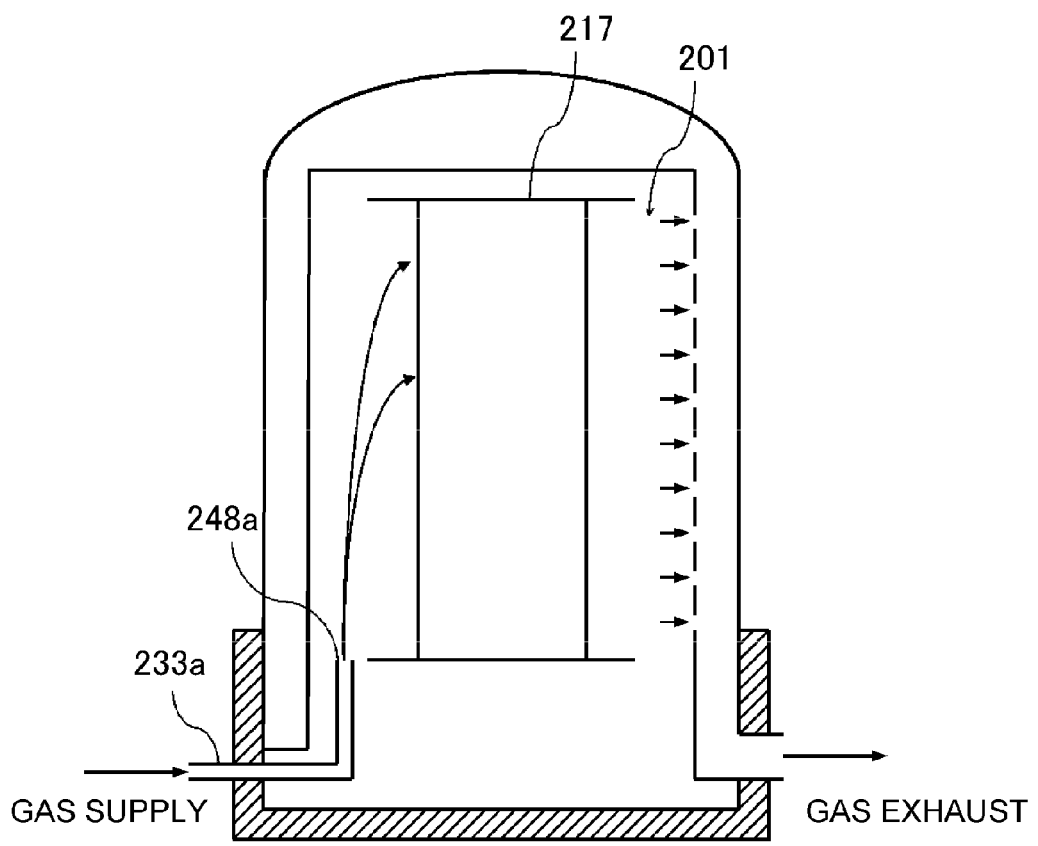

FIG. 10 is a flowchart of the substrate processing process in accordance with the embodiment. FIG. 11 is a view schematically showing a source gas supply flow in accordance with the embodiment, FIG. 11A showing the case in which a flow velocity of the source gas is a first flow velocity, and FIG. 11B showing the case in which the flow velocity of the source gas is a second flow velocity greater than the first flow velocity. FIG. 12 is a timing chart according to the gas supply of the embodiment. The substrate processing process in accordance with the embodiment will be described with reference to the drawings. FIG. 13 is a view showing a TMA gas supply sequence and processing conditions in accordance with the embodiment in comparison with a conventional art.

In the substrate processing process of the embodiment, as shown in FIG. 10, a substrate loading process S10, a pressure decrease/temperature increase process S20, an aluminum oxide film forming process S130, an atmospheric pressure returning process S40, and a substrate unloading process S50 are performed. In addition, since the processes other than the aluminum oxide film forming process S130 are performed in the same sequence and processing conditions as the first embodiment, detailed description will be omitted.

[Aluminum Oxide Film Forming Process S130]

In this embodiment, a first source gas supply process S131 to an exhaust process S136, which will be described below, are set as one cycle, and the cycle is performed a predetermined number of times, forming the aluminum oxide film 500 on the wafer 200 to a desired thickness. In addition, here, upon completion of the pressure decrease/temperature increase process S20, the TMA gas is stably generated from the TMA tank 260, and the ozone gas is stably generated from the ozonizer 270.

In the first source gas supply process S131, in substantially the same processing sequence as the source gas supply process S31 in accordance with the first embodiment, the TMA gas is supplied into the process chamber 201. At this time, for example, as shown in FIG. 11A, in order to supply the TMA gas mainly to the wafer 200 at the lower side in the process chamber 201, the flow velocity of the TMA gas is adjusted to the first flow velocity, which is relatively slow. Specifically, the flow rate of the N2 gas (the flow velocity adjusting gas) supplied through the first inert gas supply pipe 240*g* is reduced to adjust the flow velocity of the TMA gas to the first flow velocity.

The TMA gas supplied through the source gas nozzle 233*a* is directed to the gas exhaust port 204*a* from the source gas injection port 248*a* to become a substantially horizontal gas flow on the wafer 200 at the lower side in the process chamber 201. The TMA gas passed through the wafer 200 is then exhausted through the exhaust pipe 231. The TMA gas supplied to each wafer 200 causes chemisorption (surface reaction) with surfaces such as a surface of each wafer 200 or a surface of an adsorption layer of the TMA molecules already adsorbed on the wafer 200. As a result, the Al-containing layer 500*a* shown in FIG. 7B is mainly formed on the wafer 200 at the lower side in the process chamber 201.

[Exhaust Process S132]

Figure 12A:
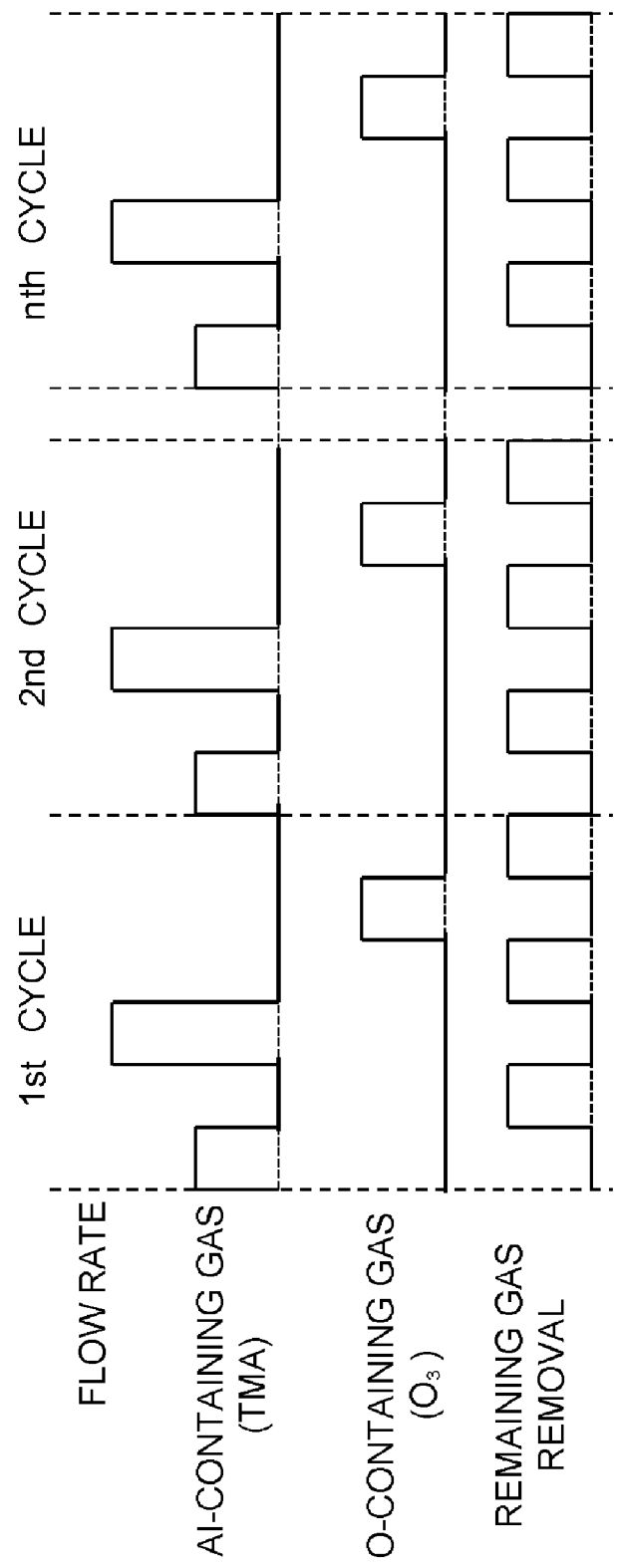

Next, in the exhaust process S132, the inside of the process chamber 201 is purged in substantially the same processing sequence and processing conditions as the exhaust process S32 in accordance with the first embodiment. As the exhaust process S132 is performed, as shown in FIG. 12A, mixing of the TMA gas supplied in the first source gas supply process S131 and the TMA gas supplied in a second source gas supply process S133, which will be described later, can be prevented.

[Second Source Gas Supply Process S133] Next, the TMA gas is supplied into the process chamber 201 in substantially the same sequence as the source gas supply process S31 in accordance with the first embodiment. At this time, for example, as shown in FIG. 11B, in order to supply the TMA gas mainly to the wafer 200 at the upper side in the process chamber 201, the flow velocity of the TMA gas is adjusted to the second flow velocity greater than the first flow velocity. Specifically, the flow rate of the N2 gas (the flow velocity adjusting gas) supplied through the first inert gas supply pipe 240*g* is increased to switch the flow velocity of the TMA gas to the second flow velocity, without change of the flow rate of the TMA gas from the process S131.

The TMA gas supplied through the source gas nozzle 233*a* is directed to the gas exhaust port 240*a* from the source gas injection port 248*a* to become a substantially horizontal gas flow on mainly the wafer 200 at the upper side in the process chamber 201. The TMA gas passed through the wafer 200 is then exhausted through the exhaust pipe 231. The TMA gas supplied to each wafer 200 causes chemisorption (surface reaction) with surfaces such as a surface of each wafer 200 or a surface of an adsorption layer of the TMA molecules already adsorbed on the wafer 200. As a result, the Al-containing layer 500*a* shown in FIG. 7B is formed on mainly the wafer 200 at the upper side in the process chamber 201. At this time, in order not to change the flow rate of the TMA gas from the process S131 and the process S133, the supply flow rate of the TMA gas to the wafer 200 is uniformized in the process 131 and the process S133. For this reason, as the processing times of the process S131 and the process S133 are set, the thickness of the Al-containing layer 500*a* formed on the wafer 200 can be easily uniformized between the wafers 200.

[Exhaust Process S134]

Then, in the exhaust process S134, the inside of the process chamber 201 is purged in substantially the same processing sequence and processing conditions as the exhaust process S32 in accordance with the first embodiment. As the exhaust process S134 is performed, as shown in FIG. 11A, mixing of the TMA gas supplied in the second source gas supply process S133 and the ozone gas supplied in a reactive gas supply process S135, which will be described below, can be prevented.

[Reactive Gas Supply Process S135]

Next, in the reactive gas supply process S135, the ozone gas is supplied into the process chamber 201 in substantially the same processing sequence and processing conditions as the reactive gas supply process S33 in accordance with the first embodiment. The ozone gas supplied into the process chamber 201 through the reactive gas nozzle 233b becomes a horizontal gas flow 10 toward the gas exhaust port 204a from the reactive gas injection port 248b, similar to the source gas shown in FIG. 5, and is exhausted through the exhaust pipe 231. At this time, the ozone gas is supplied onto each of the stacked wafers 200, and the ozone gas oxidizes the Al-containing layer 500a on each wafer 200, forming the aluminum oxide layer 500b (see FIG. 7C). In addition, since the reactive gas nozzle 233b is constituted as a porous long nozzle as described above, the supply amount of the ozone gas to the wafer 200 is uniformized between the wafers 200.

[Exhaust Process S136]

Then, in the exhaust process S136, the inside of the process chamber 201 is purged in substantially the same processing sequence and processing conditions as the exhaust process S34 in accordance with the first embodiment. As the exhaust process S136 is performed, as shown in FIG. 11A, mixing of the ozone gas supplied in the reactive gas supply process S135 and the TMA gas supplied in the first source gas supply process S131 of the next cycle can be prevented.

Next, the first source gas supply process S131 to the exhaust process S136 are set as one cycle, and the cycle is performed a predetermined number of times to form the aluminum oxide film 500 (see FIG. 7D) on the wafer 200 to a predetermined thickness. In addition, processing conditions of each process will be represented, for example, as follows.

<Processing Conditions of First Source Gas Supply Process S131>

Processing pressure: 20 to 100 Pa, preferably 50 Pa,
Flow rate of carrier gas (Ar gas): 0.1 to 2 slm, preferably 0.5 slm,
Flow rate of flow velocity adjusting gas ($N_2$ gas): 1 to 5 slm, preferably 3 slm,
Processing temperature: 450° C. to 650° C., preferably 550° C.,
Processing time: 2 to 10 seconds, preferably 5 seconds <Processing Conditions of Second Source Gas Supply Process S133>

Processing pressure: 50 to 200 Pa, preferably 120 Pa,
Flow rate of carrier gas (Ar gas): 0.1 to 2 slm, preferably 0.5 slm,
Flow rate of flow velocity adjusting gas ($N_2$ gas): 10 to 30 slm, preferably 20 slm,
Processing temperature: 450° C. to 650° C., preferably 550° C., Processing time: 2 to 10 seconds, preferably 5 seconds <Processing Conditions of Reactive Gas Supply Process S135>

Processing pressure: 50 to 200 Pa, preferably 70 Pa,
Flow rate of reactive gas (ozone gas): 3 to 20 slm, preferably 6 slm,
Flow rate of dilution gas ($N_2$ gas): 0 to 2 slm, preferably 0.5 slm,
Processing temperature: 450° C. to 650° C., preferably 550° C.,
Processing time: 10 to 60 seconds, preferably 20 seconds <Processing Conditions of Exhaust Processes S132, S134 and S136>

Processing pressure: 50 to 200 Pa, preferably 100 Pa,
Flow rate of flow velocity adjusting gas ($N_2$ gas) (first inert gas supply pipe): 1 to 10 slm, preferably 5 slm,
Flow rate of flow velocity adjusting gas ($N_2$ gas) (second inert gas supply pipe): 1 to 10 slm, preferably 5 slm,
Processing temperature: 450° C. to 650° C., preferably 550° C.,
Processing time: 5 to 60 seconds, preferably 10 seconds In addition, in the above embodiment, while the TMA gas is supplied at the second flow velocity greater than the first flow velocity after supplying the TMA gas at the first flow velocity, the embodiment is not limited thereto. For example, as shown in FIG. 12B, the TMA gas may be supplied mainly to the wafer 200 at the lower side in the process chamber 201 at the first flow velocity smaller than the second flow velocity after supplying the TMA gas mainly to the wafer 200 at the upper side in the process chamber 201 at the second flow velocity.

In addition, in the above embodiment, while the TMA gas is sequentially supplied to two regions in the process chamber 201 with the flow velocity of the TMA gas switched in two steps of the first flow velocity and the second flow velocity, the embodiment is not limited thereto. For example, the TMA gas may be sequentially supplied to three or more regions in the process chamber 201 while switching the flow velocity of the TMA gas in three or more steps. As the steps of the flow velocity are increased, the supply amount of the TMA gas may be further uniformized between the wafers 200 in one whole cycle.

(3) Effects According to the Embodiment

According to the embodiment, in addition to the effects according to the first embodiment, one or more effects will be described below.

(a) According to the embodiment, the first source gas supply process S131 of locally supplying the TMA gas mainly to the wafer 200 at the lower side in the process chamber 201 at the first flow velocity and the second source gas supply process S133 of locally supplying the TMA gas mainly to the wafer 200 at the upper side in the process chamber 201 at the second flow velocity greater than the first flow velocity are sequentially performed at each cycle. That is, rather than supplying the TMA gas evenly to all the wafers 200 through one source gas supply process, the TMA gas is locally supplied to a selected portion of the wafers 200 through one source gas supply process, and then, the flow velocity of the TMA gas is varied to change a position to which the TMA gas is mainly supplied, so that the plurality of source gas supply processes are sequentially performed at each cycle. Accordingly, while the source gas nozzle 233a is constituted as a short nozzle, the supply amount of the TMA gas can be uniformized between the wafers in one whole cycle. In addition, film thickness uniformity of the aluminum oxide film 500 between the wafers 200 can be improved.

(b) According to the embodiment, flow rates of the TMA gas and Ar gas are uniformly maintained in the first source gas supply process S131 and the second source gas supply process S133, and a flow rate of the $N_2$ gas, which is a flow velocity adjusting gas, is varied, changing the flow velocity of the TMA gas. Accordingly, the control according to the switching of the flow velocity of the TMA gas is simplified.

(c) In addition, according to the embodiment, the flow rates of the TMA gas and Ar gas are uniformly maintained, and the flow rate of the $N_2$ gas, which is a TMA gas flow velocity adjusting gas, is varied, changing the flow velocity of the TMA gas. That is, the supply amount of the TMA gas to each wafer 200 is uniformized in the first source gas supply process S131 and the second source gas supply process S133. For this reason, as the processing times or numbers of the first source gas supply process S131 and the second source gas supply process S133 are set, the thickness of the Al-containing layer 500*a*, i.e., the aluminum oxide film 500, formed on the wafer 200 can be easily uniformized between the wafers 200.

<Third Embodiment of the Invention>

Next, the third embodiment of the present invention will be described. The third embodiment is distinguished from the second embodiment in that after supplying the TMA gas into the process chamber 201 at the first flow velocity and before supplying the TMA gas into the process chamber 201 at the second flow velocity, the supply of the ozone gas in the process chamber 201 is performed. That is, in this embodiment, whenever the TMA gas is supplied into the process chamber 201 at different flow velocities, the ozone gas is supplied into the process chamber 201 to oxidize the Al-containing layer 500*a* on the wafer 200. The embodiment is particularly effective when the reactive gas has a property of being easily pyrolyzed. That is, the embodiment is particularly effective when the reactive gas nozzle 233*b* is constituted as a short nozzle similar to the source gas nozzle 233*a*. That is, hereinafter, overlapping description with the first and second embodiments will be appropriately omitted.

(1) Configuration of Process Furnace

In this embodiment, the controller 280, which is a control unit, is configured such that supply of the TMA gas mainly to the wafer 200 at the lower side in the process chamber 201 at the first flow velocity, supply of the ozone gas into the process chamber 201, supply of the TMA gas mainly to the wafer 200 at the upper side in the process chamber 210 at the second flow velocity greater than the first flow velocity, and supply of the ozone gas into the process chamber 201 are set as one cycle, and the cycle is performed a predetermined number of times.

In addition, switching of the flow velocity of the TMA gas may be performed in substantially the same way as in the second embodiment.

(2) Substrate Processing Process

Figure 14:
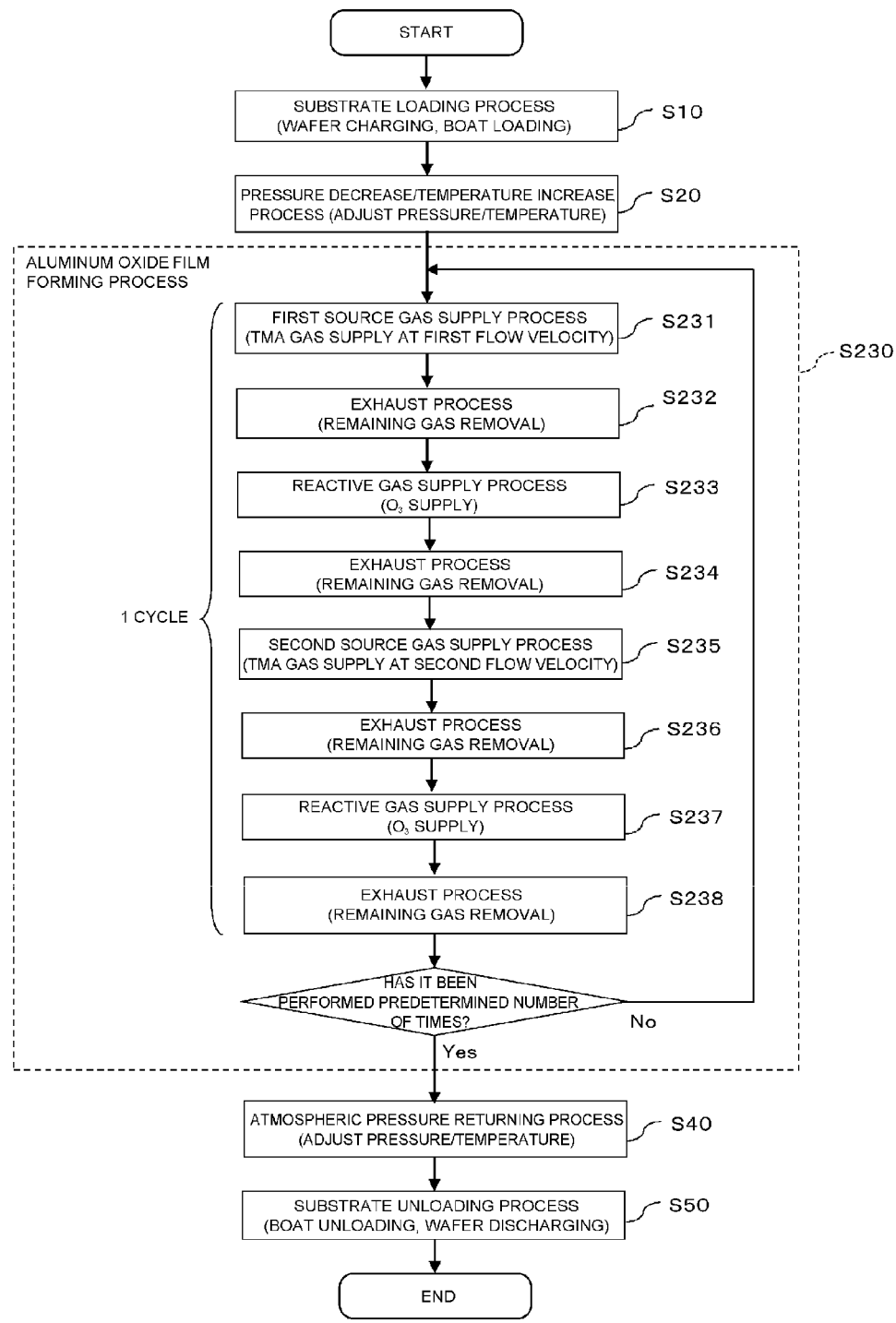
FIG. 14 is a flowchart of a substrate processing process in accordance with a third embodiment of the present invention.

Hereinafter, the substrate processing process in accordance with the embodiment will be described. FIG. 14 is a flowchart of the substrate processing process in accordance with the embodiment. FIG. 15 is a timing chart according to a gas supply of the embodiment. The substrate processing process in accordance with the embodiment will be described with reference with the drawings.

In the substrate processing process of the embodiment, as shown in FIG. 14, a substrate loading process S10, a pressure decrease/temperature increase process S20, an aluminum oxide film forming process S230, an atmospheric pressure returning process S40, and a substrate unloading process S50 are performed. In addition, since the processes other than the aluminum oxide film forming process S230 are performed in substantially the same processing sequence and processing conditions as the first and second embodiments, a detailed description thereof will be omitted.

[Aluminum Oxide Film Forming Process S230]

In this embodiment, a first source gas supply process S231 and an exhaust process S238, which will be described below, are set as one cycle, and the cycle is performed a predetermined number of times, forming the aluminum oxide film 500 on the wafer 200 to a predetermined thickness.

<First Source Gas Supply Process S231>

In the first source gas supply process S231, the TMA gas is supplied mainly to the wafer 200 at the lower side in the process chamber 201 at the first flow velocity in substantially the same sequence and processing conditions as the first source gas supply process S131 of the second embodiment (see FIG. 11A), forming the Al-containing layer 500*a* shown in FIG. 7B on the wafer 200.

<Exhaust Process S232>

Next, in the exhaust process S232, the inside of the process chamber 201 is purged in substantially the same processing sequence and processing conditions as the exhaust process S32 in accordance with the first embodiment. As the exhaust process S232 is performed, as shown in FIG. 15A, mixing of the TMA gas supplied in the first source gas supply process S231 and the ozone gas supplied in the reactive gas supply process S233 is prevented.

<Reactive Gas Supply Process S233>

Then, in the reactive gas supply process S233, the ozone gas is supplied into the process chamber 201 based on substantially the same sequence and processing conditions as the reactive gas supply process S33 in accordance with the first embodiment and the Al-containing layer 500*a* on the wafer 200 is oxidized, forming the aluminum oxide layer 500*b* shown in FIG. 7C on the wafer 200. In addition, when the reactive gas nozzle 233*b* is constituted as a short nozzle similar to the source gas nozzle 233*a*, the flow velocity of the ozone gas may be adjusted by adjusting the flow rate of the $N_2$ gas (the flow velocity adjusting gas) or the flow rate of the ozone gas from the second inert gas supply pipe 240*h*, so that the ozone gas is supplied mainly to the wafer 200 at the lower side in the process chamber 201 (the wafer 200 to which the TMA gas is supplied in the first source gas supply process S231).

<Exhaust Process S234>

Next, in the exhaust process S234, the inside of the process chamber 201 is purged in substantially the same processing sequence and processing conditions as the exhaust process S34 in accordance with the first embodiment. As the exhaust process S234 is performed, as shown in FIG. 15A, mixing of the ozone gas supplied in the reactive gas supply process S233 and the TMA gas supplied in the first source gas supply process S231, which will be described below, is prevented.

<Second Source Gas Supply Process S235>

Then, in the second source gas supply process S235, the TMA gas is supplied mainly to the wafer 200 at the upper side in the process chamber 201 at the second flow velocity in substantially the same sequence and processing conditions as the second source gas supply process S133 of the second embodiment (see FIG. 11B), forming the Al-containing layer 500*a* shown in FIG. 7B on the wafer 200. At this time, since the flow rate of the TMA gas is not varied in the process S231 and the process S235, the supply amount of the TMA gas to the wafer 200 is uniformized in the process S231 and the process S235. For this reason, as the processing times of the process S231 and the process S235 are matched, the thickness of the Al-containing layer 500*a* formed on the wafer 200 can be uniformized between the wafers 200.

<Exhaust Process S236>

Next, in the exhaust process S236, the inside of the process chamber 201 is purged in substantially the same processing sequence and processing conditions as the exhaust process S34 in accordance with the first embodiment. As the exhaust process S236 is performed, as shown in FIG. 15A, mixing of the TMA gas supplied in the second source gas supply process S235 and the ozone gas supplied in a reactive gas supply process S237, which will be described below, is prevented.

<Reactive Gas Supply Process S237>

Then, in the reactive gas supply process S237, the ozone gas is supplied into the process chamber 201 in substantially the same sequence and processing conditions as the reactive gas supply process S33 in accordance with the first embodiment to oxidize the Al-containing layer 500*a* on the wafer 200, forming the aluminum oxide layer 500*b* shown in FIG. 7C on the wafer 200. In addition, when the reactive gas nozzle 233*b* is constituted as a short nozzle similar to the source gas nozzle 233*a*, the flow velocity of the ozone gas may be adjusted similar to the reactive gas supply process S233 so that the ozone gas is supplied mainly to the wafer 200 at the upper side in the process chamber 201 (the wafer 200 to which the TMA gas is supplied in the second source gas supply process S235).

<Exhaust Process S238>

Next, in the exhaust process S238, the inside of the process chamber 201 is purged in substantially the same processing sequence and processing conditions as the exhaust process S34 in accordance with the first embodiment. As the exhaust process S238 is performed, as shown in FIG. 15A, mixing of the ozone gas supplied in the reactive gas supply process S237 and the TMA gas supplied in the first source gas supply process S231 of the next cycle is prevented.

Figure 15B:
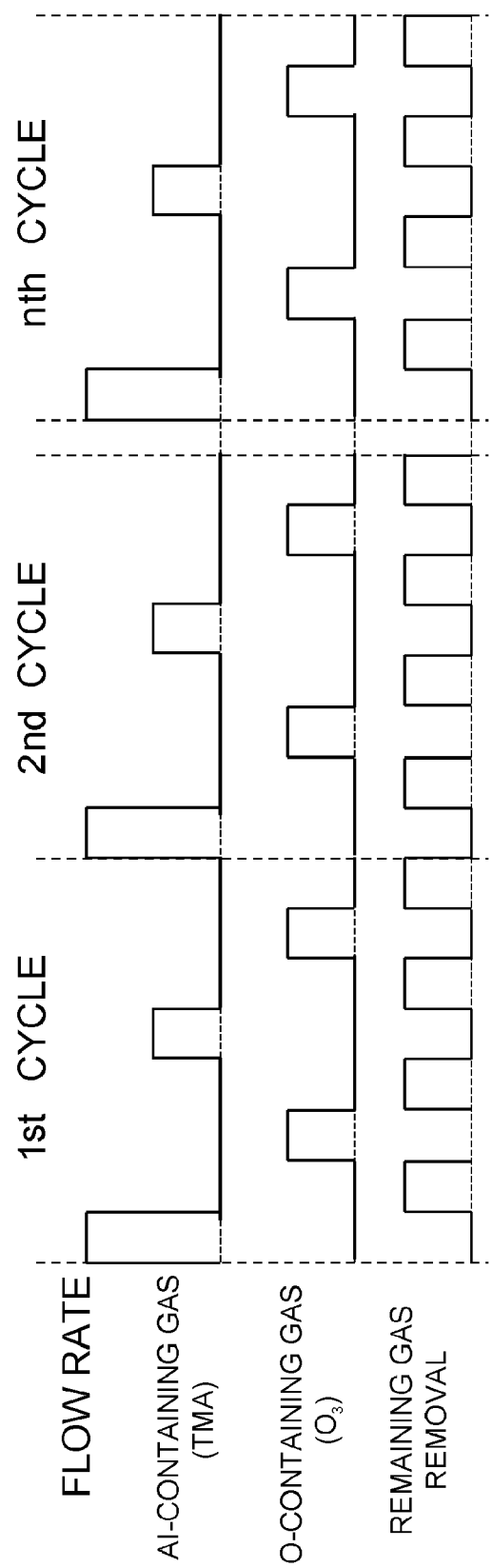

In addition, in the above embodiment, as shown in FIG. 15B; after supplying the TMA gas mainly to the wafer 200 at the upper side in the process chamber 201 at the second flow velocity, the TMA gas may be supplied mainly to the wafer 200 at the lower side in the process chamber 201 at the first flow velocity smaller than the second flow velocity. In addition, while varying the flow velocity of the TMA gas in three or more steps, the TMA gas may be sequentially supplied to three or more regions in the process chamber 201.

(3) Effects According to the Embodiment

According to the embodiment, in addition to the effects of the first and second embodiments, the following effects are provided.

In this embodiment, after supplying the TMA gas mainly to the wafer 200 at a lower side of the boat 217 in the first source gas supply process S231, the ozone gas is supplied into the process chamber 201 in the reactive gas supply process S233, and then the TMA gas is supplied mainly to the wafer 200 at an upper side of the boat 217 in the second source gas supply process S235. Accordingly, in particular, in the wafer 200 adjacent to a boundary between a region in which the TMA gas is supplied in the first source gas supply process S231 and a region in which the TMA gas is supplied in the second source gas supply process S235, since the Al-containing layer 500*a* is oxidized before a film thickness is thickened, oxidation staining can be suppressed and a difference in film quality of the aluminum oxide layer 500*b* can be suppressed.

In addition, the embodiment is particularly effective when the reactive gas has a property of being easily pyrolyzed. That is, in order to avoid pyrolysis of the reactive gas, even when the reactive gas nozzle 233*b* is constituted as a short nozzle similar to the source gas nozzle 233*a*, as the flow velocities of the reactive gases in the reactive gas supply process S233 and the reactive gas supply process S237 differ from each other, the supply amount of the reactive gas can be uniformized between the wafers 200 in one whole cycle similar to the source gas.

<Fourth Embodiment of the Invention>

In the above embodiment, while uniformly maintaining the flow rates of the TMA gas and the Ar gas (carrier gas), the flow rate of the $N_2$ gas (the flow velocity adjusting gas) supplied through the first inert gas supply pipe 240*g* is varied to switch the flow velocity of the TMA gas to the first flow velocity and the second flow velocity. However, the present invention is not limited to the embodiment. For example, like the embodiment, in a state in which the flow rate of the $N_2$ gas (the flow velocity adjusting gas) supplied through the first inert gas supply pipe 240*g* is uniformly maintained (or, the N2 gas is not supplied), the flow rate of the TMA gas may be varied to switch the flow velocity of the TMA gas to the first flow velocity and the second flow velocity. For example, when the TMA gas is supplied to the wafer 200 at the lower side in the process chamber 201, the flow rate of the TMA gas may be reduced to decrease the flow velocity of the TMA gas (the first flow velocity), and when the TMA gas is supplied to the wafer 200 at the upper side in the process chamber 201, the flow rate of the TMA gas may be increased to increase the flow velocity of the TMA gas (the second flow velocity).

In addition, when the flow rate of the TMA gas is varied, the supply amount of the TMA gas into the process chamber 201, i.e., the supply amount of the TMA gas to the wafer 200, is also varied. For this reason, when the flow velocity is varied by changing the flow rate of the TMA gas itself, the supply time or supply number of the TMA gas per one cycle may be adjusted. For example, when the flow velocity of the TMA gas is increased by increasing the flow rate of the TMA gas itself, the supply time or supply number of the TMA gas may be reduced. Similarly, when the flow velocity of the TMA gas is reduced by decreasing the flow rate of the TMA gas itself, the supply time or supply number of the TMA gas may be increased.

<Fifth Embodiment of the Invention>

The flow velocity of the TMA gas may be adjusted by a diameter of a gas injection port. For example, when the diameter of the gas injection port is large, the flow velocity of the TMA gas supplied into the process chamber 201 is decreased, and when the diameter of the gas injection port is small, the flow velocity of the TMA gas supplied into the process chamber 201 is increased. Therefrom, in this embodiment, while setting a height position of the gas injection port in the nozzle accommodating portion 201*a*, a plurality of source gas nozzles having the gas injection ports with different diameters are installed at predetermined positions in the nozzle accommodating portion 201*a* lower than the region at which the wafer 200 is to be accommodated. The source gas nozzle having the gas injection port with a large diameter is configured to supply the TMA gas mainly to the wafer 200 at the lower side in the process chamber 201 at the first flow velocity. Here, the source gas nozzle having the gas injection port with a small diameter is configured to supply the TMA gas mainly to the wafer 200 at the upper side in the process chamber 201 at the second flow velocity.

In this embodiment, rather than varying the flow rate of the N$_2$ gas (the flow velocity adjusting gas) or the TMA gas, the flow velocity of the TMA gas can be adjusted. In addition, the upstream ends of the source gas nozzle in accordance with the embodiment may be connected to, for example, the plurality of divided downstream ends of the source gas supply pipe 240*a*. In this case, the opening/closing valve may be installed at each branch portion of the source gas supply pipe 240*a* connected to the source gas nozzle. In addition, the opening/closing valve of the source gas nozzle may be configured such that the opening/closing operation is controlled by the controller 280. According to the configuration, the flow velocity of the TMA gas supplied through the source gas supply pipe 240*a* can be switched by only the opening/closing operation of the opening/closing valve of the source gas nozzle. Accordingly, the control according to the flow velocity of the TMA gas is simplified.

<Sixth Embodiment of the Invention>

The flow velocity of the TMA gas may be adjusted by a length (or a surface roughness of a nozzle inner wall) of the source gas nozzle. Since the TMA gas flows through the nozzle while generating friction with the inner wall of the source gas nozzle, for example, when the source gas nozzle is long (or a surface roughness of the nozzle inner wall is large), a friction force is increased to decrease the flow velocity of the TMA gas supplied into the process chamber 201, and when the source gas nozzle is short (or the surface roughness of the nozzle inner wall is small), the friction force is reduced to increase the flow velocity of the TMA gas supplied into the process chamber 201. Therefore, in this embodiment, while setting a height position of the gas injection port in the nozzle accommodating portion 201*a*, a plurality of source gas nozzles having different lengths (or different surface roughness of the nozzle inner wall) are installed at predetermined positions in the nozzle accommodating portion 201*a* lower than the region at which the wafer 200 is to be accommodated. The source gas nozzle having a large length (the nozzle having a large surface roughness of the inner wall) is configured to supply the TMA gas mainly to the wafer 200 at the lower side in the process chamber 201 at the first flow velocity. On the other hand, the source gas nozzle having a small length (the nozzle having a small surface roughness of the inner wall) is configured to supply the TMA gas mainly to the wafer 200 at the upper side in the process chamber 201 at the second flow velocity.

The flow velocity of the TMA gas may be adjusted without varying the flow rate of the N$_2$ gas (the flow velocity adjusting gas) or the TMA gas also in this embodiment. In addition, upstream ends of the plurality of source gas nozzles in accordance with the embodiment may be connected to, for example, the plurality of divided downstream ends of the source gas supply pipe 204*a*. In this case, the opening/closing valve may be installed at each branch portion of the source gas supply pipe 240*a* connected to the source gas nozzle. In addition, the opening/closing valve of the source gas nozzle may be configured such that the opening/closing operation is controlled by the controller 280. According to the configuration, the flow velocity of the TMA gas supplied through the source gas supply pipe 240*a* can be switched by only the opening/closing operation of the opening/closing valve of the source gas nozzle. Accordingly, the control according to the flow velocity of the TMA gas is simplified.

<Other Embodiments of the Invention>

Hereinabove, while the embodiments of the present invention have been specifically described, the present invention is not limited thereto but various modifications may be made without departing from the teaching of the present invention.

Figure 16:
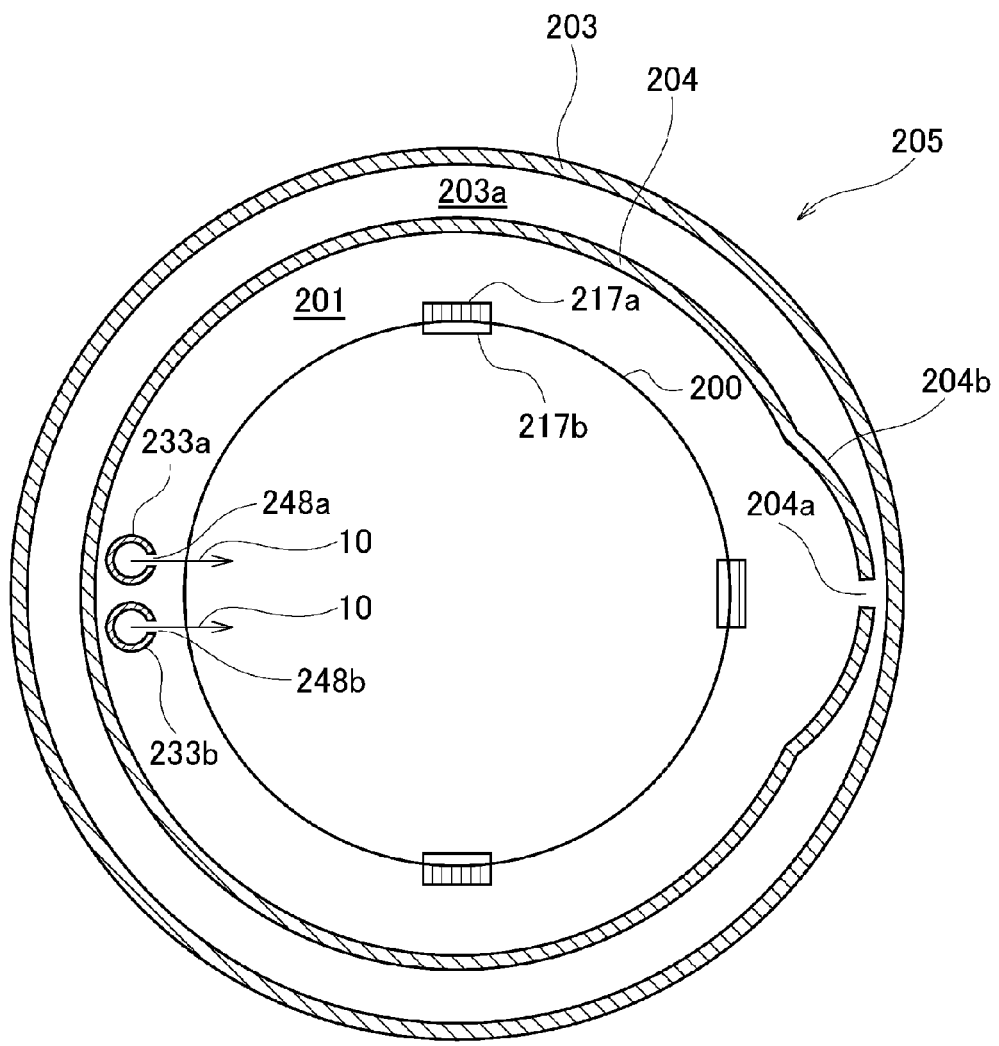
FIG. 16 is a lateral cross-sectional view of a process tube installed at a substrate processing apparatus in accordance with another embodiment of the present invention, showing the case in which a nozzle receiving portion is not installed in a process chamber.

In these embodiments, while the process chamber 201 includes the nozzle accommodating portion 201*a* and the downstream sides of the vertical portions of the source gas nozzle 233*a* and the reactive gas nozzle are configured to be accommodated in the nozzle accommodating portion 201*a* (see FIG. 4), the present invention is not limited thereto. FIG. 16 is a lateral cross-sectional view of a process tube installed in a substrate processing apparatus in accordance with the other embodiment, showing the case in which the nozzle accommodating portion 201*a* is not installed in the process chamber 201. As described above, the source gas nozzle 233*a* and the reactive gas nozzle 233*b* may be disposed immediately adjacent to the boat 217 (the wafer 200).

In the above embodiments, while TMA containing aluminum atoms has been used as a liquid source material, the present invention is not limited thereto. That is, other organic compounds or chlorides containing any one of Si atoms, Hf atoms, Zr atoms, Al atoms, Ta atoms, Ti atoms, Ru atoms, Ir atoms, Ge atoms, Sb atoms, and Te atoms may be used as the liquid source material. In addition, the TMA gas, which is generated by evaporating the TMA, need not be used as the first source gas, but other gases generated by evaporating or decomposing organic compounds or chlorides containing any one of Si atoms, Hf atoms, Zr atoms, Al atoms, Ta atoms, Ti atoms, Ru atoms, Ir atoms, Ge atoms, Sb atoms, and Te atoms may be used as the first source gas.

In the above embodiments, while the ozone gas has been used as a reactive gas to form an oxide film, the oxide film may be formed using an oxidizing agent such as O$_2$ gas or H$_2$O gas. In addition, a nitride layer may be formed using a nitriding agent such as ammonia gas, N$_2$ gas, N$_2$O, or NO$_2$ as the reactive gas.

While the above embodiments describe the case in which the aluminum oxide film is formed on the wafer 200, the present invention may be applied to the case in which any one of a Hf-oxide film, a Si-oxide film, an Al-oxide film, a Ta-oxide film, a Ti-oxide film, a Ru-oxide film, an Ir-oxide film, a Si-nitride film, an Al-nitride film, a Ti-nitride film, and a GeSbTe film is formed.

<Example>

Hereinafter, an example of the present invention will be described. In this example, an aluminum oxide film is formed on the wafer in the same way as described previously in the second embodiment. FIG. 18 is a view showing presence of accumulation of decomposed matters in a nozzle and film properties of the aluminum oxide film, comparing the example with a conventional example. In addition, gas supply conditions according to the film forming of the aluminum oxide are represented in FIG. 13.

In the first source gas supply process of the example, as shown in FIG. 13, a flow rate of Ar gas, which is a carrier gas, was 0.5 slm, and a flow rate of N$_2$ gas, which is a flow velocity adjusting gas, was 3 slm. In the second source gas supply process, as shown in FIG. 13, the flow rate of the Ar gas, which is a carrier gas, was 0.5 slm, and the flow rate of the N$_2$ gas, which is a flow velocity adjusting gas, was 20 slm.

In the conventional example, as shown in FIG. 13, the flow rate of the Ar gas, which is a carrier gas, was 0.5 slm, and the flow rate of the N$_2$ gas was 15 slm.

In FIG. 18, a film thickness of the aluminum oxide film, surface uniformity of the film thickness, uniformity of the film thickness between wafers and film properties of an amount of impurities in the film, and presence of accumulation of decomposed matters in the source gas nozzle are shown by comparing the example with the conventional example.

In the example, when the film is formed in a state in which the processing temperature is increased from 380° C. to 550° C., decomposed matters of the TMA gas are not accumulated in the source gas nozzle. Here, in the conventional example, the decomposed matters of the TMA gas were accumulated in the source gas nozzle.

In addition, in this example, even when the film was formed at a temperature of 550° C., film thickness uniformity between the wafers was ±1.1%. Here, in the conventional example, when the film was formed at the processing temperature of 550° C., which was increased from 380° C., the film thickness uniformity between the wafers was decreased to ±4.1% from ±1%, increasing a difference in film thickness between the wafers. Accordingly, in the example, while the processing temperature was increased to 550° C., the film thickness uniformity between the wafers was substantially equal to the conventional example performed at 380° C.

In addition, in this example, the number of foreign substances attached to a wafer surface was 59. Here, in the conventional art, when the film was formed at the processing temperature of 550° C. increased from 380° C., the number of foreign substances attached to the wafer surface was increased from 30 to a maximum of 500. Accordingly, even when the processing temperature is increased, an increase in the number of foreign substances attached to the wafer surface can be suppressed.

<Preferred Aspects of the Invention>

Hereinafter, preferred aspects of the present invention will be additionally stated.

[Supplementary Note 1]

A first aspect of the present invention provides a substrate processing apparatus including:

a heating unit installed outside the process chamber and configured to heat an inside of the process chamber;

a source gas supply unit configured to supply a first process gas;

a source gas nozzle connected to the source gas supply unit and configured to supply the first process gas supplied from the source gas supply unit into the process chamber;

an exhaust unit configured to exhaust the inside of the process chamber in a substantially horizontal direction; and a control unit configured to control at least the heating unit, the source gas supply unit and the exhaust unit, wherein the source gas nozzle is disposed in a region in the process chamber where the first process gas is not decomposed even when an inside temperature of the process chamber is higher than a pyrolysis temperature of the first process gas.

[Supplementary Note 2]

A second aspect of the present invention provides a substrate processing apparatus including:

a process chamber configured to accommodate therein a plurality of substrates stacked horizontally;

a heating unit installed outside the process chamber and configured to heat an inside of the process chamber;

a source gas supply unit configured to supply a first process gas;

a source gas nozzle connected to the source gas supply unit and configured to supply the first process gas supplied from the source gas supply unit into the process chamber;

an exhaust unit configured to exhaust the inside of the process chamber in a substantially horizontal direction; and a control unit configured to control at least the heating unit, the source gas supply unit and the exhaust unit, wherein the source gas nozzle is disposed in a region in the process chamber where the first process gas is not decomposed even when an inside temperature of the process chamber is higher than a pyrolysis temperature of the first process gas, and the control unit controls the source gas supply unit to supply the first process gas into the process chamber at least two times at different flow velocities such that the first process gas is prevented from being mixed.

[Supplementary Note 3]

Preferably, the substrate processing apparatus further includes:

a reactive gas supply unit configured to supply a second process gas into the process chamber; and a reactive gas nozzle connected to the reactive gas supply unit and disposed in the process chamber in a stacking direction of the plurality of substrates, the reactive gas nozzle configured to supply the second process gas supplied from the reactive gas supply unit into the process chamber, wherein the control unit controls the source gas supply unit and the reactive gas supply unit to perform a plurality of times: supplying the first process gas through the source gas nozzle at a first flow velocity; supplying the first process gas through the source gas nozzle at a second flow velocity different from the first flow velocity; and supplying the second process gas through the reactive gas nozzle to form a thin film on each of the plurality of substrates.

[Supplementary Note 4]

A third aspect of the present invention provides a substrate processing apparatus including:

a process chamber configured to accommodate therein a plurality of substrates stacked horizontally;

a heating unit installed outside the process chamber and configured to heat an inside of the process chamber;

a source gas supply unit configured to supply a first process gas;

a source gas nozzle connected to the source gas supply unit and configured to supply the first process gas supplied from the source gas supply unit into the process chamber;

an exhaust unit configured to exhaust the inside of the process chamber in a substantially horizontal direction; and a control unit configured to control at least the heating unit, the source gas supply unit and the exhaust unit, wherein the source gas nozzle has a source gas injection port disposed at a predetermined position at a lower portion of the process chamber, in which the first process gas is not decomposed even under a temperature in the process chamber higher than a pyrolysis temperature of the first process gas, and configured to supply the first process gas toward an upper portion of the process chamber, and the control unit is configured such that a cycle including a process of supplying the first process gas into the process chamber to the substrate accommodated in a lower side of the process chamber, among the plurality of substrates, at a first flow velocity and a process of supplying the first process gas to the substrate accommodated in an upper side of the process chamber, rather than the substrate accommodated in the lower side of the process chamber, among the plurality of substrates, at a second flow velocity greater than the first flow velocity is performed a predetermined number of times.

[Supplementary Note 5]

A fourth aspect of the present invention provides a substrate processing apparatus including:

an inner tube having a process chamber formed in an inner space thereof, the process chamber being configured to accommodate a plurality of substrates, which are horizontally stacked;

an outer tube configured to surround the inner tube;

a heating unit installed outside the outer tube and configured to heat the inside of the process chamber;

a source gas supply unit configured to supply a first process gas;

a source gas nozzle connected to the source gas supply unit and configured to supply the first process gas supplied from the source gas supply unit into the process chamber via a source gas supply port;

a gas exhaust port formed at a sidewall of the inner tube;

an exhaust unit configured to exhaust a space between the outer tube and the inner tube, generate a gas flow toward the gas exhaust port from the source gas injection port in a substantially horizontal direction, and exhaust the inside of the process chamber; and a control unit configured to control at least the heating unit, the source gas supply unit and the exhaust unit, wherein the source gas nozzle has the first process gas injection port disposed at a predetermined position at a lower portion of the process chamber, in which the first process gas is not decomposed even under a temperature in the process chamber higher than a pyrolysis temperature of the first process gas, and configured to supply the first process gas toward an upper portion of the process chamber, and the control unit is configured such that a cycle including a process of supplying the first process gas to the substrate accommodated in a lower side of the process chamber, among the plurality of substrates, at a first flow velocity and a process of supplying the first process gas to the substrate accommodated in an upper side of the process chamber, rather than the substrate accommodated in the lower side of the process chamber, among the plurality of substrates, at a second flow velocity greater than the first flow velocity is performed a predetermined number of times.

[Supplementary Note 6]

Preferably, the substrate processing apparatus further includes:

a reactive gas supply unit configured to supply a second process gas; and a reactive gas nozzle connected to the reactive gas supply unit, disposed in the process chamber in a stacking direction of the plurality of substrates, and configured to supply the second process gas supplied from the reactive gas supply unit into the process chamber, wherein the control unit is configured such that a process of supplying the first process gas at the first flow velocity, a process of supplying the first process gas at the second flow velocity, and a process of supplying the second process gas are set as one cycle, and the cycle is performed a predetermined number of times.

[Supplementary Note 7]

In addition, preferably, an inert gas supply pipe configured to supply an inert gas is connected to the source gas nozzle, and the control unit is configured to vary a flow rate of the inert gas to differentiate a flow velocity of the first process gas from the first flow velocity and the second flow velocity.

[Supplementary Note 8]

Further, preferably, the control unit is configured to vary a flow rate of the first process gas to differentiate a flow velocity of the first process gas from the first flow velocity and the second flow velocity, and to perform the process of supplying the first process gas at the first flow velocity for a longer time than the process of supplying the first process gas at the second flow velocity.

[Supplementary Note 9]

Furthermore, preferably, the control unit is configured to vary a flow rate of the first process gas to differentiate a flow velocity of the first process gas, and the control unit is configured to perform a cycle a predetermined number of times, the cycle including at least a process of performing the supply of the first process gas at the first flow velocity a predetermined number of times; and a process of performing the supply of the first process gas at the second flow rate fewer times than at the first flow velocity a predetermined number of times.

[Supplementary Note 10]

In addition, preferably, the plurality of source gas nozzles having the gas injection ports with different diameters are installed at the predetermined positions in the process chamber.

[Supplementary Note 11]

Further, preferably, the plurality of source gas nozzles having different lengths are installed at the predetermined positions of the process chamber.

[Supplementary Note 12]

A fifth aspect of the present invention provides a method of manufacturing a semiconductor device, including:

(a) loading a plurality of substrates stacked horizontally into a process chamber;

(b) supplying a first process gas into the process chamber at a first flow velocity through a source gas nozzle disposed in a region in the process chamber where the first process gas is not decomposed even when an inside temperature of the process chamber is higher than a pyrolysis temperature of the first process gas;

(c) supplying the first process gas into the process chamber at a second flow velocity different from the first flow velocity through the source gas nozzle;

(d) supplying a second process gas into the process chamber through a reactive gas nozzle disposed in the process chamber in a stacking direction of the plurality of substrates;

(e) exhausting the process chamber in a substantially horizontal direction; and (f) unloading the plurality of substrates from the process chamber, wherein a cycle comprising the steps (b) through (d) is performed at least once to form a thin film on each of the plurality of substrates

[Supplementary Note 13]

A sixth aspect of the present invention provides a method of manufacturing a semiconductor device, including:

(a) loading a plurality of substrates stacked horizontally into a process chamber;

(b) supplying a first process gas into the process chamber at a first flow velocity to the substrate accommodated at a lower side in the process chamber, among the plurality of substrates, through a source gas nozzle disposed in a region in the process chamber where the first process gas is not decomposed even when an inside temperature of the process chamber is higher than a pyrolysis temperature of the first process gas, the source gas nozzle having a source gas injection port directed to an upper portion of the process chamber;

(c) supplying the first process gas into the process chamber at a second flow velocity different from the first flow velocity to the substrate accommodated at an upper side of the process chamber, rather than the substrate accommodated at the lower side of the process chamber, among the plurality of substrates, through the source gas nozzle;

(d) supplying a second process gas into the process chamber through a reactive gas nozzle disposed in the process chamber in a stacking direction of the plurality of substrates;

(e) exhausting the process chamber in a substantially horizontal direction; and (f) unloading the plurality of substrates from the process chamber, wherein a cycle comprising the steps (b) through (d) is performed at least once to form a thin film on each of the plurality of substrates.

[Supplementary Note 14]

A seventh aspect of the present invention provides a method of manufacturing a semiconductor device, including:

(a) loading a plurality of substrates stacked horizontally into a process chamber provided in an inner tube;

(b) supplying a first process gas into the process chamber at a first flow velocity to the substrate accommodated at a lower side in the process chamber, among the plurality of substrates, through a source gas nozzle disposed in a region in the process chamber where the first process gas is not decomposed even when an inside temperature of the process chamber is higher than a pyrolysis temperature of the first process gas, the source gas nozzle having a source gas injection port directed to an upper portion of the process chamber;

(c) supplying the first process gas into the process chamber at a second flow velocity different from the first flow velocity to the substrate accommodated at an upper side of the process chamber, rather than the substrate accommodated at the lower side of the process chamber, among the plurality of substrates, through the source gas nozzle;

(d) supplying a second process gas into the process chamber through a reactive gas nozzle disposed in the process chamber in a stacking direction of the plurality of substrates;

(e) exhausting a space between the inner tube and an outer tube surrounding the inner tube having a sidewall at which a gas exhaust port is installed, generating a substantially horizontal gas flow toward the gas exhaust port from the source gas injection port, and exhausting the process chamber; and (f) unloading the plurality of substrates from the process chamber, wherein a cycle comprising the steps (b) through (d) is performed at least once to form a thin film on each of the plurality of substrates

[Supplementary Note 15]

Preferably, in the step (b), the first process gas is supplied into the process chamber at the first flow velocity with an inert gas from an inert gas supply pipe connected to the source gas nozzle, and in the step (c), the first process gas is supplied into the process chamber at the second flow velocity with the inert gas having a flow rate increased more than in the first source gas supply process.

[Supplementary Note 16]

In addition, preferably, the flow rate of the first process gas is varied to differentiate the flow velocities of the first process gas in the step (b) and the step (c), and the step (b) is performed for a longer time than in the step (c).

[Supplementary Note 17]

Further, preferably, the flow rate of the first process gas is varied to differentiate the flow velocities of the first process gas in the first source gas supply process and the second source gas supply process, the step (b) is performed a predetermined number of times, and the step (c) is performed a predetermined number of times fewer than the first source gas supply process.

[Supplementary Note 18]

An eighth aspect of the present invention provides a semiconductor device including a thin film disposed on a substrate formed by performing (a) supplying a first process gas into a process chamber accommodating the substrate at a first flow velocity through a source gas nozzle disposed in a region in the process chamber where the first process gas is not decomposed even when an inside temperature of the process chamber is higher than a pyrolysis temperature of the first process gas; (b) supplying the first process gas into the process chamber at a second flow velocity different from the first flow velocity through the source gas nozzle; (c) supplying a second process gas into the process chamber through a reactive gas nozzle disposed in the process chamber in a stacking direction of the substrate; and (d) performing a cycle comprising the steps (a) through (c) at least once.

What is claimed is:

1. A method of manufacturing a semiconductor device, comprising:
  (a) loading, into a process chamber, a plurality of substrates stacked horizontally;
  (b) forming a film on the plurality of substrates by performing:
    (b-1) heating an inside of the process chamber using a heating unit installed outside the process chamber;
    (b-2) supplying a source gas into the process chamber through a source gas nozzle disposed at a predetermined position therein where the source gas is not decomposed even when an inside temperature of the process chamber is higher than a pyrolysis temperature of the source gas, wherein the source gas nozzle is connected to a source gas supply unit configured to supply the source gas and disposed in a nozzle accommodating portion projecting outward and installed at an inner wall of the process chamber, and the source gas is supplied by performing:
      (b-2-1) simultaneously supplying the source gas at a predetermined flow rate and a flow velocity adjusting gas at a first flow rate into the process chamber through the source gas nozzle to locally supply the source gas to substrates at a lower side of the process chamber; and
      (b-2-2) simultaneously supplying the source gas at the predetermined flow rate and the flow velocity adjusting gas at a second flow rate greater than the first flow rate into the process chamber through the source gas nozzle to locally supply the source gas to substrates at an upper side of the process chamber;
    (b-3) supplying a reactive gas into the process chamber through a reactive gas nozzle connected to a reactive gas unit configured to supply the reactive gas and disposed in the nozzle accommodating portion; and
    (b-4) exhausting the process chamber in a substantially horizontal direction using an exhaust unit; and
  (c) unloading the plurality of substrates from the process chamber after the substrates have been completely processed.

2. A method of manufacturing a semiconductor device, comprising:
(a) loading, into a process chamber, a plurality of substrates stacked horizontally;
(b) forming a film on the plurality of substrates by performing:
(b-1) heating an inside of the process chamber using a heating unit installed outside the process chamber;
(b-2) supplying a source gas into the process chamber through a source gas nozzle disposed at a predetermined position therein where the source gas is not decomposed even when an inside temperature of the process chamber is higher than a pyrolysis temperature of the source gas, wherein the source gas nozzle is connected to a source gas supply unit configured to supply the source gas, and the source gas is supplied by performing:
(b-2-1) simultaneously supplying the source gas at a predetermined flow rate and a flow velocity adjusting gas at a first flow rate into the process chamber through the source gas nozzle to locally supply the source gas to substrates at a lower side of the process chamber; and
(b-2-2) simultaneously supplying the source gas at the predetermined flow rate and the flow velocity adjusting gas at a second flow rate greater than the first flow rate into the process chamber through the source gas nozzle to locally supply the source gas to substrates at an upper side of the process chamber;
(b-3) supplying a reactive gas into the process chamber through a reactive gas nozzle connected to a reactive gas unit configured to supply the reactive gas and disposed in the process chamber along a stacked direction of the plurality of substrates; and
(b-4) exhausting the process chamber in a substantially horizontal direction; and
(c) unloading the plurality of substrates from the process chamber after the substrates have been completely processed.

3. The method of claim 1, wherein the flow velocity adjusting gas comprises an inert gas.

4. The method of claim 1, wherein the second flow rate is more than two times the first flow rate.

5. The method of claim 4, wherein the second flow rate is more than six times the first flow rate.

6. The method of claim 1, wherein a time duration of the step (b-2-1) is equal to that of the step (b-2-2).

7. The method of claim 1, wherein the steps (b-2-1), (b-4), (b-2-2), (b-4), (b-3), and (b-4) are sequentially repeated a plurality number of times.

8. The method of claim 1, wherein the steps (b-2-1), (b-4), (b-3), (b-4), (b-2-2), (b-4), (b-3), and (b-4) are sequentially repeated a plurality number of times.

9. The method of claim 1, wherein the steps (b-2-2), (b-4), (b-2-1), (b-4), (b-3), and (b-4) are sequentially repeated a plurality number of times.

10. The method of claim 1, wherein the steps (b-2-2), (b-4), (b-3), (b-4), (b-2-1), (b-4), (b-3) and (b-4) are sequentially repeated a plurality number of times.

* * * * *